(12) United States Patent
Suzuki et al.

(10) Patent No.: US 11,899,199 B2
(45) Date of Patent: Feb. 13, 2024

(54) OPTICAL DEVICE

(71) Applicant: HAMAMATSU PHOTONICS K.K., Hamamatsu (JP)

(72) Inventors: Daiki Suzuki, Hamamatsu (JP); Takuma Osaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 526 days.

(21) Appl. No.: 17/043,983

(22) PCT Filed: May 10, 2019

(86) PCT No.: PCT/JP2019/018794
§ 371 (c)(1),
(2) Date: Sep. 30, 2020

(87) PCT Pub. No.: WO2019/216424
PCT Pub. Date: Nov. 14, 2019

(65) Prior Publication Data
US 2021/0033848 A1 Feb. 4, 2021

(30) Foreign Application Priority Data
May 11, 2018 (JP) .................................. 2018-092108

(51) Int. Cl.
*G02B 26/08* (2006.01)
*B81B 3/00* (2006.01)

(52) U.S. Cl.
CPC ........ *G02B 26/0858* (2013.01); *B81B 3/0045* (2013.01); *B81B 2201/042* (2013.01)

(58) Field of Classification Search
CPC .............. G02B 26/0858; G02B 26/101; G02B 26/0841; G02B 26/085; G02B 26/08;
(Continued)

(56) References Cited

U.S. PATENT DOCUMENTS 8,654,426 B2 * 2/2014 Yamada ................. G02B 26/10
359/212.1
11,048,077 B2 * 6/2021 Mizoguchi ......... G02B 27/0149
(Continued)

FOREIGN PATENT DOCUMENTS

CN 102200667 A 9/2011
CN 104880821 A 9/2015
(Continued)

OTHER PUBLICATIONS

International Preliminary Report on Patentability dated Nov. 26, 2020 for PCT/JP2019/018794.

*Primary Examiner* — Euncha P Cherry
(74) *Attorney, Agent, or Firm* — Faegre Drinker Biddle & Reath LLP

(57) ABSTRACT

An optical device includes a support portion, a first movable portion having an optical surface, a second movable portion having a frame shape and surrounding the first movable portion, a first coupling portion coupling the first movable portion and the second movable portion to each other, a second coupling portion coupling the second movable portion and the support portion to each other, and a softening member which has a softening characteristic and to which stress is applied when the first movable portion swings around a first axis. When viewed in a direction perpendicular to the optical surface, the softening member is provided to a portion of the second movable portion, the portion extending between a drive element and the first coupling portion, and is not electrically connected to an outside.

22 Claims, 9 Drawing Sheets

(58) Field of Classification Search
CPC ............ B81B 3/0045; B81B 2201/042; B81B 2201/032; B81B 2203/058; B81B 3/0018; H02K 41/02
See application file for complete search history.

(56) References Cited

U.S. PATENT DOCUMENTS

| | | |
|---|---|---|
| 2004/0184124 A1 | 9/2004 | Ikegame et al. |
| 2012/0162739 A1 | 6/2012 | Yamada |
| 2016/0006330 A1 | 1/2016 | Fujimoto |

FOREIGN PATENT DOCUMENTS

| | | |
|---|---|---|
| CN | 104950435 A | 9/2015 |
| CN | 105556383 A | 5/2016 |
| JP | 2000-330067 A | 11/2000 |
| JP | 2002-023097 A | 1/2002 |
| JP | 2003-029190 A | 1/2003 |
| JP | 2007-226108 A | 9/2007 |
| JP | 2008-083122 A | 4/2008 |
| JP | 2010-534163 A | 11/2010 |
| JP | 2011-043554 A | 3/2011 |
| JP | 2012-133242 A1 | 7/2012 |
| JP | 2013-092750 A | 5/2013 |
| JP | 2014-198363 A | 10/2014 |
| JP | 2016-206235 A | 12/2016 |
| JP | 2017-129783 A | 7/2017 |
| WO | WO 2009/014396 A1 | 1/2009 |
| WO | WO 2013/111266 A1 | 8/2013 |
| WO | WO 2014/122781 A1 | 8/2014 |

\* cited by examiner (a)

(b)

(a)

(b)

(a)

(b)

(a)

(b)

OPTICAL DEVICE

TECHNICAL FIELD

One aspect of the present disclosure relates to an optical device configured as, for example, a micro electro mechanical systems (MEMS) device.

BACKGROUND ART

As a MEMS device, there is known an optical device including a support portion, a movable portion, and a coupling portion that couples the movable portion and the support portion to each other so as for the movable portion to be swingable around a predetermined axis and is torsionally deformed when the movable portion swings. In such an optical device, the coupling portion may have a hardening characteristic where the spring constant increases with an increase in torsional angle. When the coupling portion has the hardening characteristic, there is concern that the control characteristic of the deflection angle of the movable portion deteriorates. In order to solve this problem, there is proposed a technique where the coupling portion is formed of two spring plates facing each other with a predetermined gap therebetween to thereby suppress the hardening characteristic of the coupling portion (refer to Patent Literature 1).

CITATION LIST

Patent Literature

Patent Literature 1: Japanese Unexamined Patent Publication No. 2000-330067

SUMMARY OF INVENTION

Technical Problem

In the above-described technique of the related art, a swinging axis is located between the two spring plates, and thus when the movable portion swings, stress other than torsional stress is locally applied to the coupling portion. As a result, there is concern that the coupling portion is damaged. In particular, when the swinging of the movable portion is accelerated or the deflection angle is increased, stress to be applied to the coupling portion is increased, and thus the possibility of damage to the coupling portion becomes noticeable.

Therefore, one aspect of the present disclosure is to provide an optical device in which even when the swinging of a movable portion is accelerated or the deflection angle is increased, an influence of a hardening characteristic of a coupling portion can be suppressed and reliability can be secured.

Solution to Problem

According to one aspect of the present disclosure, there is provided an optical device including: a support portion; a first movable portion having an optical surface; a second movable portion having a frame shape and surrounding the first movable portion; a first coupling portion coupling the first movable portion and the second movable portion to each other so as for the first movable portion to be swingable around a first axis; a second coupling portion coupling the second movable portion and the support portion to each other; and a softening member which has a softening characteristic and to which stress is applied when the first movable portion swings around the first axis. When viewed in a direction perpendicular to the optical surface, the softening member is provided to a portion of the second movable portion, the portion extending between a drive element and the first coupling portion, and is not electrically connected to an outside.

In the optical device, in order to suppress an influence of the hardening characteristic of the first coupling portion on the control characteristic of the deflection angle of the first movable portion, the softening member having the softening characteristic is provided. In order to suppress an influence of the hardening characteristic of the first coupling portion, the softening member is required to be provided to a position where stress is applied when the first movable portion swing. Meanwhile, in order to suppress the occurrence of a defect in the softening member to secure reliability, the softening member is required to be provided to a position where excessive stress is not applied when the first movable portion swings. In the optical device, when viewed in the direction perpendicular to the optical surface, the softening member is provided to the portion of the second movable portion, the portion extending between the drive element and the first coupling portion. Accordingly, while excessive stress is avoided from being applied to the softening member, at least a part of the hardening characteristic of the first coupling portion can be cancelled out by the softening characteristic of the softening member. As a result, according to the optical device, even when the swinging of the first movable portion is accelerated or the deflection angle is increased, an influence of the hardening characteristic of the first coupling portion can be suppressed and reliability can be secured. Furthermore, since the softening member is not electrically connected to the outside, the degree of freedom in designing the softening member can be improved.

According to another aspect of the present disclosure, there is provided an optical device including: a support portion; a first movable portion having an optical surface; a second movable portion having a frame shape and surrounding the first movable portion; a first coupling portion including a linear portion that extends along a first axis and is connected to the second movable portion, and coupling the first movable portion and the second movable portion to each other so as for the first movable portion to be swingable around the first axis; a second coupling portion coupling the second movable portion and the support portion to each other; a drive element provided to the second movable portion and electrically connected to an outside; and a softening member which has a softening characteristic and to which stress is applied when the first movable portion swings around the first axis. When viewed in a direction perpendicular to the optical surface, the softening member is provided to a portion of the second movable portion, the portion extending between the drive element and the linear portion, is provided to the second movable portion so as to be located inside the drive element and outside the linear portion, and is not electrically connected to the outside.

In the optical device, when viewed in the direction perpendicular to the optical surface, the softening member having the softening characteristic is provided to the portion of the second movable portion, the portion extending between the drive element and the linear portion. Accordingly, while excessive stress is avoided from being applied to the softening member, at least a part of the hardening characteristic of the first coupling portion can be cancelled out by the softening characteristic of the softening member. As a result, according to the optical device, even when the swinging of the first movable portion is accelerated or the deflection angle is increased, an influence of the hardening characteristic of the first coupling portion can be suppressed and reliability can be secured. Furthermore, since the softening member is not electrically connected to the outside, the degree of freedom in designing the softening member can be improved. Furthermore, since the first coupling portion includes the linear portion, for example, as compared to when the first coupling portion has a curved shape in its entirety, the concentration of stress on the first coupling portion is less likely to occur when the first movable portion swings; and thereby, damage to the first coupling portion can be suppressed.

The second coupling portion may couple the second movable portion and the support portion to each other so as for the first movable portion to be swingable around the first axis by vibrating the second movable portion. In this case, the first movable portion can be swung by vibrating the second movable portion vibrates.

The second coupling portion may couple the second movable portion and the support portion to each other so as for the second movable portion to be swingable around a second axis that intersects with the first axis. In this case, the second movable portion is swingable around the second axis, together with the first movable portion.

According to another aspect of the present disclosure, there is provided an optical device including: a support portion; a first movable portion having an optical surface; a first coupling portion coupling the first movable portion and the support portion to each other so as for the first movable portion to be swingable around a first axis; a drive element provided to at least one of the support portion and the first movable portion and electrically connected to an outside; and a softening member which has a softening characteristic and to which stress is applied when the first movable portion swings around the first axis. When viewed in a direction perpendicular to the optical surface, the softening member is provided to a portion of the first movable portion, the portion extending between the optical surface and the first coupling portion, and is not electrically connected to the outside.

In the optical device, when viewed in the direction perpendicular to the optical surface, the softening member having the softening characteristic is provided to the portion of the first movable portion, the portion extending between the optical surface and the first coupling portion. Accordingly, while excessive stress is avoided from being applied to the softening member, at least a part of the hardening characteristic of the first coupling portion can be cancelled out by the softening characteristic of the softening member. As a result, according to the optical device, even when the swinging of the first movable portion is accelerated or the deflection angle is increased, an influence of the hardening characteristic of the first coupling portion can be suppressed and reliability can be secured. Furthermore, since the softening member is not electrically connected to the outside, the degree of freedom in designing the softening member can be improved.

When viewed in the direction perpendicular to the optical surface, the softening member may be provided to a portion of the first movable portion, the portion extending between the drive element, which is provided to the first movable portion, and the first coupling portion. In this case, while excessive stress is certainly avoided from being applied to the softening member, at least a part of the hardening characteristic of the first coupling portion can be effectively cancelled out by the softening characteristic of the softening member.

According to another aspect of the present disclosure, there is provided an optical device including: a support portion; a first movable portion having an optical surface; a first coupling portion including a linear portion that extends along a first axis and is connected to the first movable portion, and coupling the first movable portion and the support portion to each other so as for the first movable portion to be swingable around the first axis; a drive element provided to at least one of the support portion and the first movable portion and electrically connected to an outside; and a softening member which has a softening characteristic and to which stress is applied when the first movable portion swings around the first axis. When viewed in a direction perpendicular to the optical surface, the softening member is provided to a portion of the first movable portion, the portion extending between the optical surface and the linear portion, and is not electrically connected to the outside.

In the optical device, when viewed in the direction perpendicular to the optical surface, the softening member having the softening characteristic is provided to the portion of the first movable portion, the portion extending between the optical surface and the linear portion. Accordingly, while excessive stress is avoided from being applied to the softening member, at least a part of the hardening characteristic of the first coupling portion can be cancelled out by the softening characteristic of the softening member. As a result, according to the optical device, even when the swinging of the first movable portion is accelerated or the deflection angle is increased, an influence of the hardening characteristic of the first coupling portion can be suppressed and reliability can be secured. Furthermore, since the softening member is not electrically connected to the outside, the degree of freedom in designing the softening member can be improved. Furthermore, since the first coupling portion includes the linear portion, for example, as compared to when the first coupling portion has a curved shape in its entirety, the concentration of stress on the first coupling portion is less likely to occur when the first movable portion swings; and thereby, damage to the first coupling portion can be suppressed.

When viewed in the direction perpendicular to the optical surface, the softening member may be provided to a portion of the first movable portion, the portion extending between the drive element provided to the first movable portion and the linear portion. In this case, while excessive stress is certainly avoided from being applied to the softening member, at least a part of the hardening characteristic of the first coupling portion can be effectively cancelled out by the softening characteristic of the softening member.

The optical device according to one aspect of the present disclosure may further include a fixed portion. The support portion may be coupled to the fixed portion so as for the first movable portion to be swingable around the first axis by vibrating the support portion.

In this case, the first movable portion can be swung by vibrating the support portion.

The optical device according to one aspect of the present disclosure may further include a fixed portion. The support portion may be coupled to the fixed portion so as for the support portion to be swingable around a second axis that intersects with the first axis. In this case, the support portion is swingable around the second axis, together with the first movable portion.

The softening member may be provided to a position where a maximum stress to be applied to the softening member when the first movable portion swings around the first axis is $1/20$ times or more a maximum stress to be applied to the first coupling portion when the first movable portion swings around the first axis. In this case, an influence of the hardening characteristic of the first coupling portion can be effectively suppressed by the softening member.

The softening member may be provided to a position where a maximum stress to be applied to the softening member when the first movable portion swings around the first axis is smaller than a 0.2% proof stress or a yield stress of the softening member. In this case, a defect can be effectively suppressed from occurring in the softening member and reliability can be further improved.

The optical device according to one aspect of the present disclosure may further include a pair of the softening members. When viewed in the direction perpendicular to the optical surface, the pair of softening members may be symmetrically disposed relative to each other with respect to a straight line passing through a center of the first movable portion and perpendicular to the first axis. In this case, an influence of the hardening characteristic of the first coupling portion can be more effectively suppressed by the pair of softening members. Furthermore, the weight can be uniformly balanced.

The softening member may be made of metal. In this case, an influence of the hardening characteristic of the first coupling portion can be even more effectively suppressed by the softening member.

The softening member may be embedded in a groove. In this case, for example, as compared to when the softening member is disposed on the surface, the optical device can be downsized.

The drive element may be a coil. Also in such an optical device, an influence of the hardening characteristic of the first coupling portion can be suppressed and reliability can be secured.

The drive element may be a piezoelectric element. Also in such an optical device, an influence of the hardening characteristic of the first coupling portion can be suppressed and reliability can be secured.

At least a part of the first coupling portion may be located on the first axis. In this case, unlike the above-described technique of the related art, when the first movable portion swings, stress other than torsional stress can be suppressed from being locally applied to the first coupling portion, and a defect can be suppressed from occurring in the first coupling portion.

Advantageous Effects of Invention

According to one aspect of the present disclosure, it is possible to provide the optical device where even when the swinging of the movable portion is accelerated or the deflection angle is increased, an influence of the hardening characteristic of the coupling portion can be suppressed and reliability can be secured.

DESCRIPTION OF EMBODIMENTS

Hereinafter, an embodiment of the present disclosure will be described in detail with reference to the drawings. In the following description, the same reference signs are used for the same or equivalent components and duplicate descriptions will be omitted.

Figure 1:
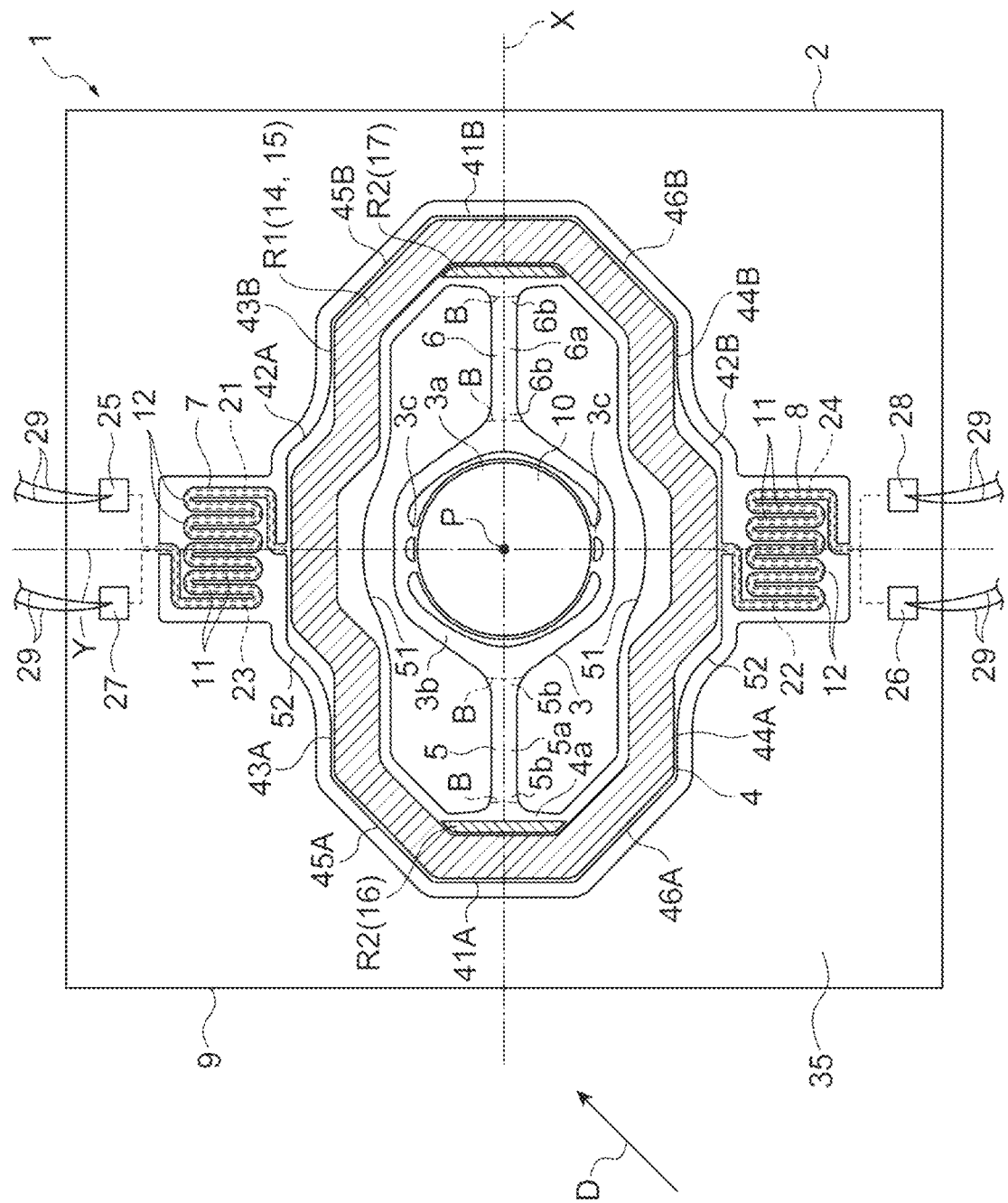
FIG. 1 is a plan view of an optical device according to an embodiment.

As illustrated in FIG. 1, an optical device 1 includes a support portion (fixed portion) 2, a first movable portion 3, a second movable portion (support portion) 4, a pair of first torsion bars (first coupling portions) 5 and 6, a pair of second torsion bars (second coupling portions) 7 and 8, and a magnetic field generation portion 9. The support portion 2, the first movable portion 3, the second movable portion 4, the pair of first torsion bars 5 and 6, and the pair of second torsion bars 7 and 8 are integrally formed by, for example, a silicon on insulator (SOI) substrate. Namely, the optical device 1 is configured as a MEMS device. The SOI substrate includes a pair of silicon layers and an insulation layer between the pair of silicon layers. The support portion 2 is formed of the pair of silicon layers and the insulation layer. The first movable portion 3, the second movable portion 4, the pair of first torsion bars 5 and 6, and the pair of second torsion bars 7 and 8 are formed in one of the silicon layers. In the optical device 1, the first movable portion 3 having a mirror surface (optical surface) 10 swings around each of an X-axis (first axis) and a Y-axis (second axis perpendicular to the first axis) orthogonal to each other. The optical device 1 is used in, for example, an optical switch for optical communication, an optical scanner, and the like. The optical device 1 is produced by using MEMS techniques (patterning, etching, and the like).

The magnetic field generation portion 9 is formed of, for example, permanent magnets having a Halbach array and the like. The magnetic field generation portion 9 generates, for example, a magnetic field in a direction D inclined at 45 degrees with respect to each of the X-axis and the Y-axis in plan view, to apply the magnetic field to a coil 14 to be described later. Incidentally, "in plan view" means "when viewed in a direction perpendicular to the mirror surface 10", in other words, means "when viewed in a direction perpendicular to the X-axis and the Y-axis". In plan view, the direction D of the magnetic field generated by the magnetic field generation portion 9 may be inclined at an angle other than 45 degrees relative to the X-axis and the Y-axis.

The support portion 2 has, for example, a quadrilateral external shape in plan view and is formed in a frame shape. The support portion 2 is disposed on one side in the direction perpendicular to the X-axis and the Y-axis relative to the magnetic field generation portion 9. The support portion 2 supports the first movable portion 3, the second movable portion 4, and the like. The first movable portion 3 is disposed inside the support portion 2 in a state where the first movable portion 3 is separated from the magnetic field generation portion 9. The first movable portion 3 has a symmetrical shape with respect to each of the X-axis and the Y-axis in plan view. The first movable portion 3 includes a main body portion 3a, a ring portion 3b, and a pair of coupling portions 3c.

The main body portion 3a has a circular shape in plan view, but may be formed in any shape such as an elliptical shape, a quadrilateral shape, or a diamond shape. In plan view, a center P of the main body portion 3a coincides with an intersection of the X-axis and the Y-axis. The mirror surface 10 that has a circular shape and is a metallic membrane made of, for example, aluminum is provided on a surface of the main body portion 3a opposite to the magnetic field generation portion 9. The mirror surface 10 is provided on substantially the entire above surface, but may be provided on a part of the above surface. The ring portion 3b is formed in a ring shape so as to surround the main body portion 3a in plan view. The ring portion 3b has an octagonal external shape in plan view, but may have any shape such as a circular shape, an elliptical shape, a quadrilateral shape, or a diamond shape. The pair of coupling portions 3c are disposed on both sides of the main body portion 3a on the Y-axis to couple the main body portion 3a and the ring portion 3b to each other.

The second movable portion 4 is formed in a frame shape, and is disposed inside the support portion 2 so as to surround the first movable portion 3 in a state where the second movable portion 4 is separated from the magnetic field generation portion 9. The second movable portion 4 includes a pair of first connection portions 41A and 41B, a pair of second connection portions 42A and 42B, a pair of first linear portions 43A and 43B, a pair of second linear portions 44A and 44B, a pair of third linear portions 45A and 45B, and a pair of fourth linear portions 46A and 46B. The second movable portion 4 has a symmetrical shape with respect to each of the X-axis and the Y-axis in plan view. In the following description, being symmetrical with respect to the X-axis or the Y-axis refers to being symmetrical in plan view.

The first connection portions 41A and 41B are located on both sides of the first movable portion 3 in an X-axis direction parallel to the X-axis. Namely, each of the first connection portions 41A and 41B has a portion facing the first movable portion 3 in the X-axis direction in plan view. Each of the first connection portions 41A and 41B extends along a Y-axis direction.

The second connection portions 42A and 42B are located on both sides of the first movable portion 3 in the Y-axis direction parallel to the Y-axis. Namely, each of the second connection portions 42A and 42B has a portion facing the first movable portion 3 in the Y-axis direction in plan view. Each of the second connection portions 42A and 42B extends along the X-axis direction. An inner edge of each of the second connection portions 42A and 42B in plan view has a recessed portion 51 recessed in the Y-axis direction. An outer edge of each of the second connection portions 42A and 42B in plan view has a protrusion portion 52 protruding in the Y-axis direction. In plan view, the recessed portion 51 and the protrusion portion 52 are located on the Y-axis.

The first linear portions 43A and 43B are located on both sides of the second connection portion 42A in the X-axis direction to be connected to the second connection portion 42A. Each of the first linear portions 43A and 43B extends along the X-axis direction. The first linear portions 43A and 43B are symmetrically disposed relative to each other with respect to the Y-axis. The second linear portions 44A and 44B are located on both sides of the second connection portion 42B in the X-axis direction to be connected to the second connection portion 42B. Each of the second linear portions 44A and 44B extends along the X-axis direction. The second linear portions 44A and 44B are symmetrically disposed relative to each other with respect to the Y-axis.

The third linear portions 45A and 45B are located opposite the second connection portion 42A relative to the first linear portions 43A and 43B and connected to the first linear portion 43A or 43B and the first connection portion 41A or 41B. In plan view, the third linear portion 45A extends in the direction inclined at 45 degrees relative to each of the X-axis and the Y-axis. The third linear portion 45B extends symmetrically relative to the third linear portion 45A with respect to the Y-axis.

The fourth linear portions 46A and 46B are located opposite the second connection portion 42B relative to the second linear portions 44A and 44B and connected to the second linear portion 44A or 44B and the first connection portion 41A or 41B. The fourth linear portion 46A extends symmetrically relative to the third linear portion 45A with respect to the X-axis. The fourth linear portion 46B extends symmetrically relative to the fourth linear portion 46A with respect to the Y-axis, and extends symmetrically relative to the third linear portion 45B with respect to the X-axis.

The first torsion bars 5 and 6 are disposed on both sides of the first movable portion 3 on the X-axis. The first torsion bars 5 and 6 couple the first movable portion 3 (ring portion 3b) and the second movable portion 4 to each other on the X-axis so as for the first movable portion 3 to be swingable around the X-axis (with the X-axis as a center line). The first torsion bars 5 and 6 are, as will be described later, connected to the support portion 2 via the second movable portion 4 and the second torsion bars 7 and 8. Namely, the first torsion bars 5 and 6 can be also regarded as coupling the first movable portion 3 and the support portion 2 to each other so as for the first movable portion 3 to be swingable around the X-axis. The first torsion bars 5 and 6 are connected to the second movable portion 4 at the first connection portions 41A and 41B. Each of the first torsion bars 5 and 6 is torsionally deformed when the first movable portion 3 swings around the X-axis. Each of the first torsion bars 5 and 6 has a plate shape extending along a plane parallel to the mirror surface 10. The entirety of each of the first torsion bars 5 and 6 is located on the X-axis.

The first torsion bar 5 includes a linear portion 5a extending along the X-axis and having a constant width, and a pair of widened portions 5b connected to both ends of the linear portion 5a. The first torsion bar 5 is connected to the first movable portion 3 at one widened portion 5b and is connected to the second movable portion 4 at the other widened portion 5b. In plan view, the width of the one widened portion 5b becomes wider as it approaches the first movable portion 3, and the width of the other widened portion 5b becomes wider as it approaches the second movable portion 4. A pair of edges of each of the widened portions 5b are curved to protrude toward each other. Each of the widened portions 5b is provided to reduce stress that is to be applied to a connection portion between the first torsion bar 5 and the first movable portion 3 or the second movable portion 4 when the first movable portion 3 swings around the X-axis. At least one of the pair of widened portions 5b may not be provided. The width of a portion in the first torsion bar 5 means the length in a direction perpendicular to an extending direction of the first torsion bar 5 (in the present embodiment, the length in the Y-axis direction). This point applies also to the first torsion bar 6.

The first torsion bar 6 is symmetrically disposed relative to the first torsion bar with respect to the Y-axis. Namely, the first torsion bar 6 includes a linear portion 6a extending along the X-axis and having a constant width, and a pair of widened portions 6b connected to both ends of the linear portion 6a. The first torsion bar 6 is connected to the first movable portion 3 at one widened portion 6b and is connected to the second movable portion 4 at the other widened portion 6b. In plan view, the width of the one widened portion 6b becomes wider as it approaches the first movable portion 3, and the width of the other widened portion 6b becomes wider as it approaches the second movable portion 4. A pair of edges of each of the widened portions 6b are curved to protrude toward each other. Each of the widened portions 6b is provided to reduce stress that is to be applied to a connection portion between the first torsion bar 6 and the first movable portion 3 or the second movable portion 4 when the first movable portion 3 swings around the X-axis. At least one of the pair of widened portions 5b may not be provided.

In the present embodiment, the first torsion bar 5 refers to a portion where stress to be applied when the first movable portion 3 swings around the X-axis is 90% or more of the maximum stress to be applied to the first torsion bar 5 when the first movable portion 3 swings around the X-axis. In other words, stress to be applied to the first movable portion 3 or the second movable portion 4 when the first movable portion 3 swings around the X-axis is less than 90% of the maximum stress to be applied to the first torsion bar 5 when the first movable portion 3 swings around the X-axis. Similarly, the first torsion bar 6 refers to a portion where stress to be applied when the first movable portion 3 swings around the X-axis is 90% or more of the maximum stress to be applied to the first torsion bar 6 when the first movable portion 3 swings around the X-axis. In FIG. 1, an example of the boundary between each of the first torsion bars 5 and 6 and the first movable portion 3 and the second movable portion 4 is indicated by dash-dot line B.

The second torsion bars 7 and 8 are disposed on both sides of the second movable portion 4 on the Y-axis. The second torsion bars 7 and 8 couple the second movable portion 4 and the support portion 2 to each other on the Y-axis so as for the second movable portion 4 to be swingable around the Y-axis (with the Y-axis as a center line). The second torsion bars 7 and 8 are connected to the second movable portion 4 at the second connection portions 42A and 42B. Each of the second torsion bars 7 and 8 is torsionally deformed when the second movable portion 4 swings around the Y-axis. In plan view, each of the second torsion bars 7 and 8 extends in a meandering manner. Each of the second torsion bars 7 and 8 includes a plurality of linear portions 11 and a plurality of folded portions 12. The plurality of linear portions 11 each extend along the Y-axis direction and are disposed side by side in the X-axis direction. The plurality of folded portions 12 alternately couple both ends of the linear portions 11 adjacent to each other.

Figure 2:
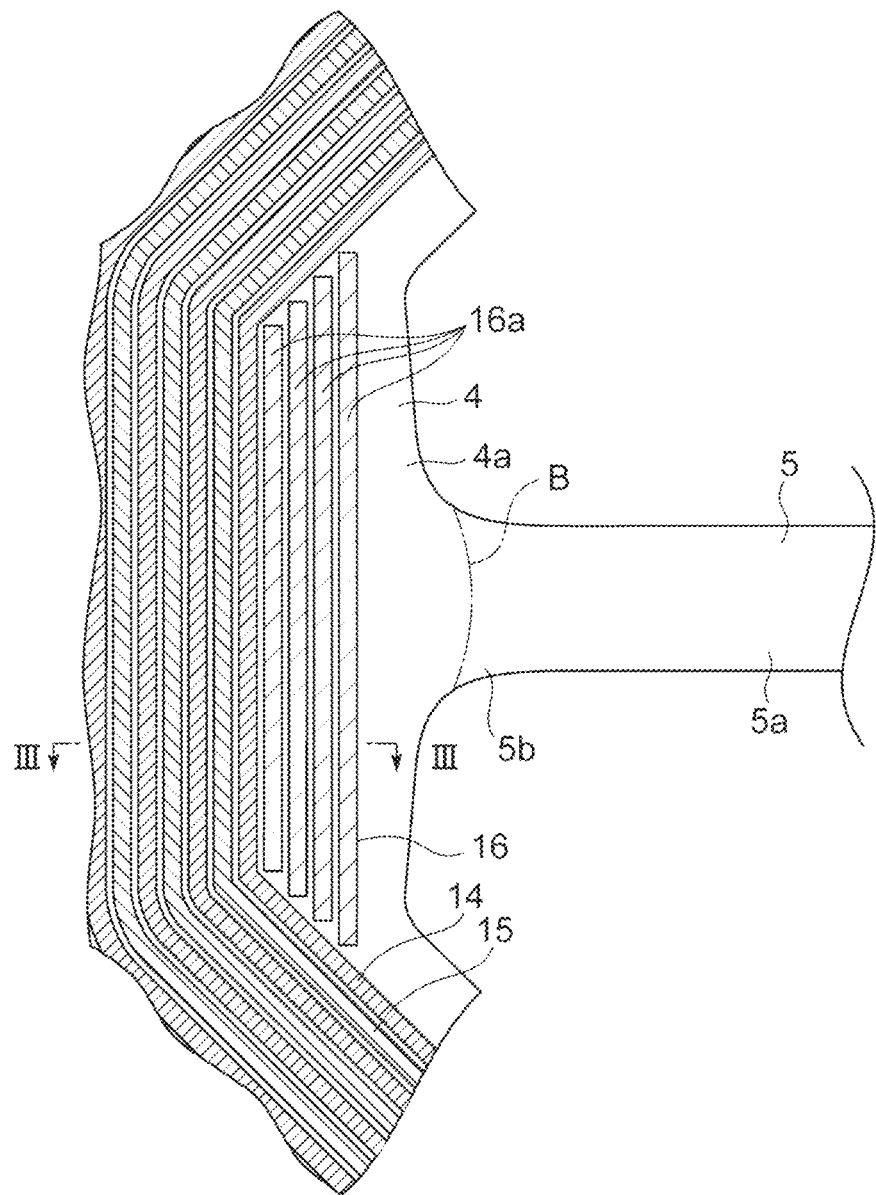
FIG. 2 is a plan view illustrating a portion of FIG. 1 in an enlarged manner.

As illustrated in FIGS. 1 and 2, the optical device 1 further includes a pair of coils 14 and 15, a pair of softening members 16 and 17, a first wiring 21, a second wiring 22, a third wiring 23, a fourth wiring 24, a first external terminal 25, a second external terminal 26, a third external terminal 27, a fourth external terminal 28, and four pairs of wires 29. Each of the coils 14 and 15 is provided in the second movable portion 4 so as to surround the first movable portion 3, and has a spiral shape in plan view. Each of the coils 14 and 15 is disposed along a plane including the X-axis and the Y-axis. Each of the coils 14 and 15 is wound around the first movable portion 3 multiple times. In plan view, the pair of coils 14 and 15 are disposed to alternately line up in a width direction of the second movable portion 4.

In FIG. 1, a disposition region R1 where the coils 14 and 15 are disposed is indicated by hatching. Each of the coils 14 and 15 extends in the first connection portions 41A and 41B and the linear portions 43A to 46B along extending directions of the first connection portions 41A and 41B and the linear portions 43A to 46B. In the first connection portions 41A and 41B and the linear portions 43A to 46B, an outer edge of the disposition region R1 is along outer edges of the first connection portions 41A and 41B and the linear portions 43A to 46B, and an inner edge of the disposition region R1 is along inner edges of the first connection portions 41A and 41B and the linear portions 43A to 46B.

Figure 3:
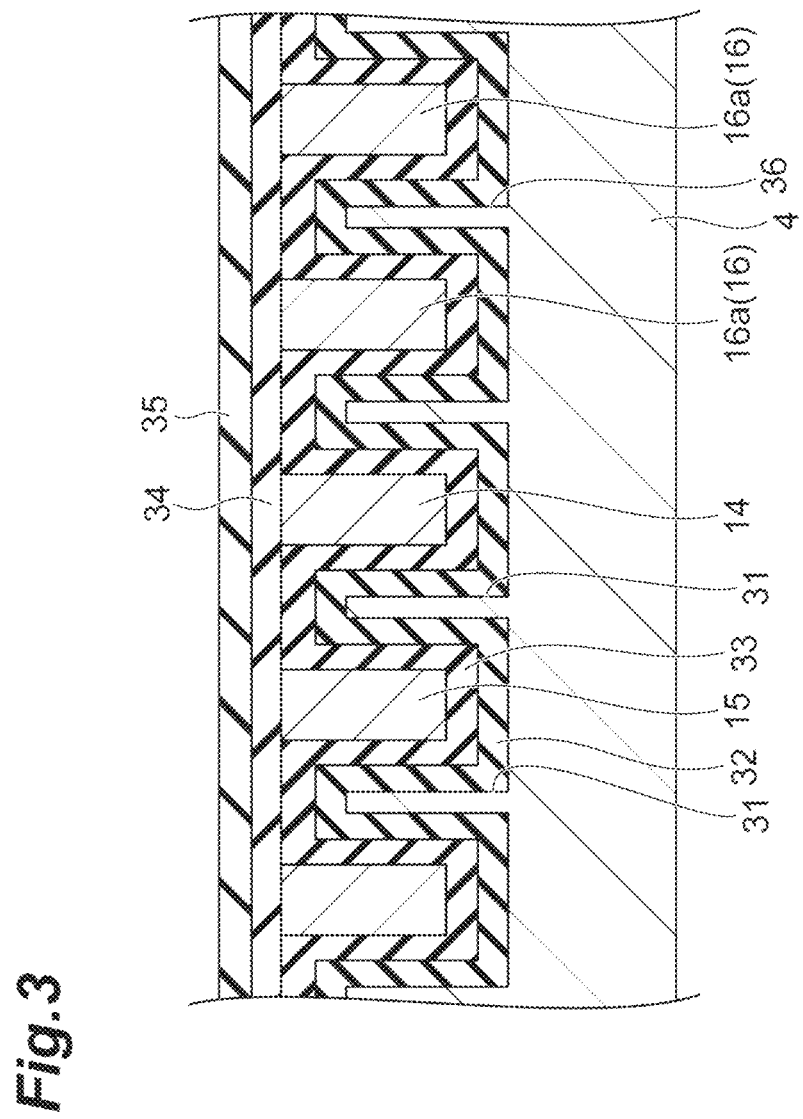
FIG. 3 is a cross-sectional view along line III-III illustrated in FIG. 1.

FIG. 3 is a cross-sectional view along line II-II illustrated in FIG. 2. As illustrated in FIG. 3, the second movable portion 4 is provided with a groove 31 having a shape corresponding to the coils 14 and 15. An insulation layer 32 is provided on an inner surface of the groove 31, and an insulation layer 33 is provided on the insulation layer 32. The coils 14 and 15 are disposed in the groove 31 with the insulation layers 32 and 33 interposed therebetween. Each of the coils 14 and 15 is a damascene wiring embedded in the second movable portion 4. Each of the coils 14 and 15 is made of, for example, a metallic material such as copper (Cu) or gold (Au).

An insulation layer 34 is provided to cover the coils 14 and 15 and the insulation layer 33. An insulation layer 35 is provided on the insulation layer 34. The insulation layers 32 to 35 are made of, for example, silicon oxide, silicon nitride, silicon oxynitride, or the like. The insulation layers 32 to 35 are integrally formed to cover the surfaces (surfaces opposite to the magnetic field generation portion 9) of the support portion 2, the first movable portion 3, the second movable portion 4, the first torsion bars 5 and 6, and the second torsion bars 7 and 8.

The softening member 16 is provided in the first connection portion 41A of the second movable portion 4 so as to be located between the first torsion bar 5 and the coils 14 and 15 in plan view. The softening member 17 is provided in the first connection portion 41B of the second movable portion 4 so as to be located between the first torsion bar 6 and the coils 14 and 15 in plan view. In FIG. 1, a disposition region R2 where the softening members 16 and 17 are disposed is indicated by hatching. Details of the softening members 16 and 17 will be described later.

Each of the external terminals 25 to 28 is, for example, an electrode pad provided in the support portion 2, and is exposed to the outside from the insulation layer 35. A pair of the wires 29 are electrically connected to each of the external terminals 25 to 28. Each of the wires 29 is drawn to the outside from the optical device 1. The external terminals 25 to 28 each are electrically connected to a drive source or the like, which is disposed outside the optical device 1, via the wires 29.

The first wiring 21 is electrically connected to an inner end portion of the coil 14 and the first external terminal 25. The first wiring 21 extends from the inner end portion of the coil 14 to the first external terminal 25 via the second torsion bar 7. The second wiring 22 is electrically connected to an outer end portion of the coil 14 and the second external terminal 26. The second wiring 22 is connected to, for example, the outer end portion of the coil 14 on the Y-axis. The second wiring 22 extends from the outer end portion of the coil 14 to the second external terminal 26 via the second torsion bar 8. As described above, the coil 14 is electrically connected to the outside of the optical device 1.

The third wiring 23 is electrically connected to an inner end portion of the coil 15 and the third external terminal 27. The third wiring 23 extends from the inner end portion of the coil 15 to the third external terminal 27 via the second torsion bar 7. The fourth wiring 24 is electrically connected to an outer end portion of the coil 15 and the fourth external terminal 28. The fourth wiring 24 is connected to, for example, the outer end portion of the coil 15 on the Y-axis. The fourth wiring 24 extends from the outer end portion of the coil 15 to the fourth external terminal 28 via the second torsion bar 8. As described above, the coil 15 is electrically connected to the outside of the optical device 1.

In the optical device 1 configured as described above, when a drive signal for a linear operation is input to the coil 14 via the external terminals 25 and 26 and the wirings 21 and 22, a Lorentz force is applied to the coil 14 due to interaction with the magnetic field generated by the magnetic field generation portion 9. The mirror surface 10 (first movable portion 3) can be subjected to a linear operation around the Y-axis, together with the second movable portion 4, by using the balance between the Lorentz force and the elastic force of the second torsion bars 7 and 8.

Meanwhile, when a drive signal for a resonance operation is input to the coil 15 via the external terminals 27 and 28 and the wirings 23 and 24, a Lorentz force is applied to the coil 15 due to interaction with the magnetic field generated by the magnetic field generation portion 9. The mirror surface 10 (first movable portion 3) can be subjected to a resonance operation around the X-axis by using the resonance of the first movable portion 3 at a resonance frequency in addition to the Lorentz force. Specifically, when a drive signal with a frequency equal to the resonance frequency of the first movable portion 3 around the X-axis is input to the coil 15, the second movable portion 4 vibrates slightly around the X-axis at the frequency. The vibration is transmitted to the first movable portion 3 via the first torsion bars 5 and 6, and thus the first movable portion 3 can swing around the X-axis at the frequency. It should be noted that when the first movable portion 3 is stationary, the entirety of each of the first torsion bars 5 and 6 is located on the X-axis whereas, when the first movable portion 3 swings, only a part of each of the first torsion bars 5 and 6 may be located on the X-axis. For example, when the center of gravity of the first movable portion 3 is located lower than the X-axis (on a magnetic field generation portion 9 side) due to ribs or the like provided at the first movable portion 3, the first movable portion 3 swings in a lower position than the position when stationary. In this case, when the first movable portion 3 swings, only a portion of each of the first torsion bars 5 and 6, the portion being connected to the support portion 2, is located on the X-axis. Alternatively, when the first movable portion 3 is swings, the entirety of each of the first torsion bars 5 and 6 may be located on the X-axis or when the first movable portion 3 is stationary, only a part of each of the first torsion bars 5 and 6 may be located on the X-axis.

Subsequently, the details of the softening members 16 and 17 will be described. As illustrated in FIG. 2, the softening member 16 includes a plurality of (four in the present embodiment) dummy wiring portions 16a. The plurality of dummy wiring portions 16a each extend along the Y-axis direction and are disposed side by side in the X-axis direction. In the four dummy wiring portions 16a, the dummy wiring portion 16a closer to the first torsion bar 5 has the longer length. In other words, in the dummy wiring portions 16a adjacent to each other in the X-axis direction, the length of the dummy wiring portion 16a located on a first torsion bar 5 side is longer than the length of the dummy wiring portion 16a located on a coils 14 and 15 side. Accordingly, the softening member 16 can be disposed along the bending shape of the coils 14 and 15, and the disposition region of the softening member 16 can be secured. Furthermore, as the length of the dummy wiring portion 16a is longer in the direction perpendicular to the extending direction of the first torsion bar 5, the dummy wiring portion 16a can be disposed up to a position where stress to be applied when the first movable portion 3 swings around the X-axis is smaller. Thus, the magnitude of a softening characteristic to be described later can be easily adjusted. The widths of the dummy wiring portions 16a are equal to each other. Each of the dummy wiring portions 16a is made of, for example, the same metallic material as that of the coils 14 and 15. Each of the dummy wiring portions 16a may be made of a metallic material different from the metallic material forming the coils 14 and 15, or may be made of, for example, copper, gold, tungsten (W), aluminum (Al), or the like. Incidentally, in FIG. 2, for convenience of description, the coils 14 and 15 and the softening members 16 and 17 are hatched; however, FIG. 2 does not illustrate a cross section.

In plan view, the softening member 16 is disposed in a portion 4a of the second movable portion 4, the portion 4a extending between the coils 14 and 15 and the first torsion bars 5 and 6. In the present embodiment, the portion 4a is a portion of the second movable portion 4 inside the coils 14 and 15, and extends in a ring shape between the coils 14 and 15 and the first torsion bars 5 and 6. In other words, in plan view, the softening member 16 is provided in the second movable portion 4 so as to be located inside the coils 14 and 15 and outside the first torsion bars 5 and 6. Here, "inside" and "outside" are defined relative to a center P (the center of the first movable portion 3 and the center of the mirror surface 10) of the main body portion 3a in plan view. The expression "the softening member 16 is located inside the coils 14 and 15" means that the distance from the center P of the main body portion 3a to the softening member 16 is smaller than the distance from the center P to the coils 14 and 15 (distance along a straight line passing through the center P and the softening member 16), and the expression "the softening member 16 is located outside the first torsion bars 5 and 6" means that the distance from the center P to the softening member 16 is larger than the distance from the center P to the first torsion bars 5 and 6.

Unlike the coils 14 and 15, the softening member 16 is not electrically connected to the outside. Namely, the softening member 16 is electrically independent from the outside. Meanwhile, each of the dummy wiring portions 16a of the softening member 16 has the same configuration (shape, material, and the like) as that of the coils 14 and 15. Namely, the dummy wiring portion 16a is a dummy wiring portion that has the same configuration as that of the coils 14 and 15 but is not electrically connected to the outside. The dummy wiring portion 16a can be formed at the same time (in parallel) the coils 14 and 15 are formed. Accordingly, a process of producing the optical device 1 can be simplified.

As illustrated in FIG. 3, each of the dummy wiring portions 16a is embedded in a groove 36 provided in the second movable portion 4. The groove 36 has a shape corresponding to each of the dummy wiring portions 16a. The groove 36 has the same cross-sectional shape as that of the groove 31. Namely, each of the dummy wiring portions 16a has the same cross-sectional shape as that of the coils 14 and 15. Each of the dummy wiring portions 16a is disposed in the groove 36 with the insulation layers 32 and 33 interposed therebetween, and is covered with the insulation layers 34 and 35.

The softening member 17 is symmetrically disposed relative to the softening member 16 with respect to the Y-axis, and has the same configuration as that of the softening member 16. Namely, the softening member 17 includes a plurality of (four in the present embodiment) dummy wiring portions having the same configuration as that of the dummy wiring portions 16a of the softening member 16. The dummy wiring portion of the softening member 17 is embedded in a groove provided in the second movable portion 4. In plan view, the softening member 17 is disposed in the portion 4a of the second movable portion 4, the portion 4a extending between the coils 14 and 15 and the first torsion bars 5 and 6. The softening member 17 is not electrically connected to the outside.

Figure 4:
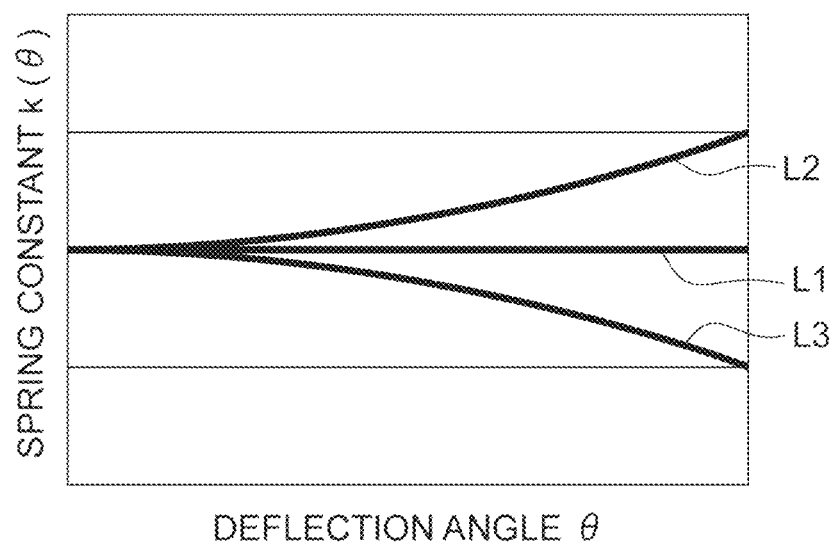
FIG. 4 is a graph for describing a hardening characteristic and a softening member.
Figure 5:
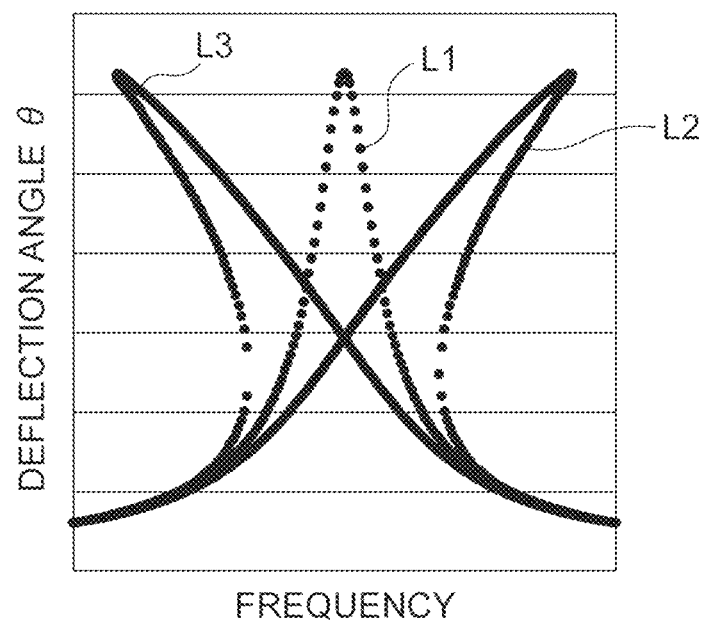
FIG. 5 is a graph for describing an influence of the hardening characteristic and the softening member on the control characteristic of the deflection angle.

FIG. 4 is a graph for describing a hardening characteristic and the softening member. FIG. 5 is a graph for describing an influence of the hardening characteristic and the softening member on the control characteristic of the deflection angle. In general, an elastically deformable member has, as indicated by reference sign L1, a characteristic where the spring constant is constant relative to the torsional angle. Meanwhile, the first torsion bars 5 and 6 having a rectangular cross section as in the present embodiment have, as indicated by reference sign L2, the hardening characteristic where the spring constant increases with an increase in torsional angle.

When each of the first torsion bars 5 and 6 has the hardening characteristic, as described below, the control characteristic of the deflection angle of the first movable portion 3, namely, the deflection angle of the mirror surface 10 may deteriorate. The swinging of the first movable portion 3 can be represented by the following equation (1) that is the equation of motion. In equation (1), $\theta$ is the deflection angle of the mirror surface 10, j is the moment of inertia of the first movable portion 3, $c(\theta)$ is the viscous force of the system, $k(\theta)$ is the spring constant of the first torsion bars 5 and 6, and $T(\theta, t)$ is torque applied to the first movable portion 3.

[Equation 1]

$$j\frac{d^2\theta}{dt} + c(\theta)\frac{d\theta}{dt} + k(\theta)\theta = T(\theta, t) \quad (1)$$

In this case, the spring constant $k(\theta)$ can be approximated as in the following equation (2). In equation (2), $k_0$ is a parameter representing the magnitude of the spring constant and $\beta$ is a parameter representing the magnitude of non-linearity. A case where the parameter $\beta$ is positive means that the first torsion bars 5 and 6 have the hardening characteristic. A case where the parameter $\beta$ is negative means that the first torsion bars 5 and 6 have a softening characteristic where the spring constant decreases with an increase in torsional angle.

[Equation 2]

$$k(\theta) = k_0(1+\beta\theta^2) \quad (2)$$

As illustrated in FIG. 5, the frequency characteristic of the deflection angle $\theta$ is changed according to the sign of the parameter $\beta$. When the parameter $\beta$ is positive (reference sign L2), the frequency characteristic is inclined toward a positive side of the frequency as compared to when the parameter $\beta$ is 0 (reference sign L1). When the parameter $\beta$ is negative (reference sign L3), the frequency characteristic is inclined toward a negative side of the frequency as compared to when the parameter $\beta$ is 0 (reference sign L1). The degrees of the inclination increase as the absolute value of the parameter $\beta$ increases.

When the first torsion bars 5 and 6 have the hardening characteristic and the frequency characteristic is inclined, the deflection angle $\theta$ is greatly changed due to a very small change in drive frequency (resonance frequency), and thus there is concern that the control characteristic of the deflection angle $\theta$ deteriorates. It is required to increase the parameter $k_0$ in order to accelerate the swinging of the mirror surface 10, and when the parameter $k_0$ is increased, an influence of the hardening characteristic of the first torsion bars 5 and 6 on the control characteristic of the deflection angle $\theta$ becomes noticeable.

Therefore, in the optical device 1, in order to suppress the influence of the hardening characteristic of the first torsion bars 5 and 6, the softening members 16 and 17 described above are provided. Since the softening members 16 and 17 are made of a plastically deformable material, the softening members 16 and 17 have the softening characteristic where the spring constant decreases with an increase in torsional angle. Stress is applied to the softening member 16 and the softening member 17 when the first movable portion 3 swings around the X-axis. At least a part of the hardening characteristic of the first torsion bars 5 and 6 can be cancelled out by the softening characteristic of the softening members 16 and 17.

Here, in order to suppress an influence of the hardening characteristic of the first torsion bars 5 and 6, the softening members 16 and 17 are required to be disposed in a position where stress is applied when the first movable portion 3 swings. For this reason, in plan view, the softening members 16 and 17 are disposed in the portion 4a of the second movable portion 4, namely, inside the coils 14 and 15. The reason is that the coils 14 and 15 are disposed in a position where stress to be applied when the first movable portion 3 swings around the X-axis is relatively small but when the first movable portion 3 swings around the X-axis, stress having a predetermined magnitude or larger is applied to a region in the second movable portion 4 inside the coils 14 and 15.

More specifically, the softening members 16 and 17 are disposed in a position where the maximum stress to be applied to the softening members 16 and 17 when the first movable portion 3 swings around the X-axis is 1/20 times or more the maximum stress to be applied to the first torsion bars 5 and 6 when the first movable portion 3 swings around the X-axis. Accordingly, an influence of the hardening characteristic of the first torsion bars 5 and 6 can be effectively suppressed by the softening members 16 and 17.

Meanwhile, in order to suppress the occurrence of a defect in the softening members 16 and 17 to secure reliability, the softening members 16 and 17 are required to be disposed in a position where excessive stress is not applied when the first movable portion 3 swings. For this reason, in plan view, the softening members 16 and 17 are disposed in the portion 4a of the second movable portion 4, namely, outside the first torsion bars 5 and 6. The reason is that relatively large stress is applied to the first torsion bars 5 and 6 when the first movable portion 3 swings around the X-axis.

More specifically, the softening members 16 and 17 are disposed in a position where the maximum stress to be applied to the softening members 16 and 17 when the first movable portion 3 swings around the X-axis is smaller than the yield stress (yield point) of the softening members 16 and 17. Furthermore, the softening members 16 and 17 are disposed in a position where the maximum stress to be applied to the softening members 16 and 17 when the first movable portion 3 swings around the X-axis is ½ times or less the maximum stress to be applied to the first torsion bars 5 and 6 when the first movable portion 3 swings around the X-axis. Accordingly, a defect can be suppressed from occurring in the softening members 16 and 17.

As described above, in the optical device 1, in plan view, the softening members 16 and 17 having the softening characteristic are disposed in the portion 4*a* of the second movable portion 4, the portion 4*a* extending between the coils 14 and 15 and the first torsion bars 5 and 6. Accordingly, while excessive stress is avoided from being applied to the softening members 16 and 17, at least a part of the hardening characteristic of the first torsion bars 5 and 6 can be cancelled out by the softening characteristic of the softening members 16 and 17. As a result, according to the optical device 1, even when the swinging of the first movable portion 3 is accelerated or the deflection angle is increased, an influence of the hardening characteristic of the first torsion bars 5 and 6 can be suppressed and reliability can be secured. Furthermore, since the softening members 16 and 17 are not electrically connected to the outside, the degree of freedom in designing the softening members 16 and 17 can be improved.

In addition, in the optical device 1, the second torsion bars 7 and 8 couple the second movable portion 4 and the support portion 2 to each other so as for the second movable portion 4 to be swingable around the Y-axis. Accordingly, the second movable portion 4 is swingable around the Y-axis, together with the first movable portion 3.

In addition, in the optical device 1, the softening members 16 and 17 are disposed in the position where the maximum stress to be applied to the softening members 16 and 17 when the first movable portion 3 swings around the X-axis is ¹⁄₂₀ times or more the maximum stress to be applied to the first torsion bars 5 and 6 when the first movable portion 3 swings around the X-axis. Accordingly, an influence of the hardening characteristic of the first torsion bars 5 and 6 can be effectively suppressed by the softening members 16 and 17.

In addition, in the optical device 1, the softening members 16 and 17 are disposed in the position where the maximum stress to be applied to the softening members 16 and 17 when the first movable portion 3 swings around the X-axis is smaller than the yield stress of the softening members 16 and 17. Accordingly, a defect can be effectively suppressed from occurring in the softening members 16 and 17 and reliability can be further improved.

In addition, in the optical device 1, in plan view, the pair of softening members 16 and 17 are symmetrically disposed relative to each other with respect to the Y-axis (straight line passing through the center of the first movable portion 3 and perpendicular to the X-axis). Accordingly, an influence of the hardening characteristic of the first torsion bars 5 and 6 can be more effectively suppressed by the pair of softening members 16 and 17. Furthermore, the weight can be uniformly balanced.

In addition, in the optical device 1, the softening members 16 and 17 are made of metal. Accordingly, an influence of the hardening characteristic of the first torsion bars 5 and 6 can be even more effectively suppressed by the softening members 16 and 17.

In addition, in the optical device 1, the softening members 16 and 17 are embedded in the groove 36. Accordingly, for example, as compared to when the softening members 16 and 17 are disposed on the surface of the second movable portion 4, the softening members 16 and 17 having a large volume can be disposed in a smaller space, and the optical device 1 can be downsized.

In addition, the optical device 1 includes the coils 14 and 15 as drive elements. Also in the optical device 1 described above, an influence of the hardening characteristic of the first torsion bars 5 and 6 can be suppressed and reliability can be secured.

In addition, in the optical device 1, unlike the above-described technique in the related art, at least a part of the first torsion bars 5 and 6 is located on the X-axis, and thus when the first movable portion 3 swings, stress other than torsional stress can be suppressed from being locally applied to the first torsion bars 5 and 6, and a defect can be suppressed from occurring in the first torsion bars 5 and 6.

The embodiment of the present disclosure has been described above; however, the present disclosure is not limited to the above embodiment. The optical device 1 may be configured as in a first modification example illustrated in FIG. 6(*a*). In the first modification example, the main body portion 3*a* and the mirror surface 10 have an elliptical shape. The ring portion 3*b* has a rectangular external shape in plan view. The second movable portion 4 has a rectangular external shape in plan view. The first torsion bar 5 includes the linear portion 5*a* and the widened portion 5*b* connected to the linear portion 5*a* and the first movable portion 3. An opposite side end portion of the linear portion 5*a* from the widened portion 5*b* is directly connected to the second movable portion 4. The first torsion bar 6 includes the linear portion 6*a* and the widened portion 6*b* connected to the linear portion 6*a* and the first movable portion 3. An opposite side end portion of the linear portion 6*a* from the widened portion 6*b* is directly connected to the second movable portion 4. Each of the second torsion bars 7 and 8 extends linearly along the Y-axis direction.

Figure 6:
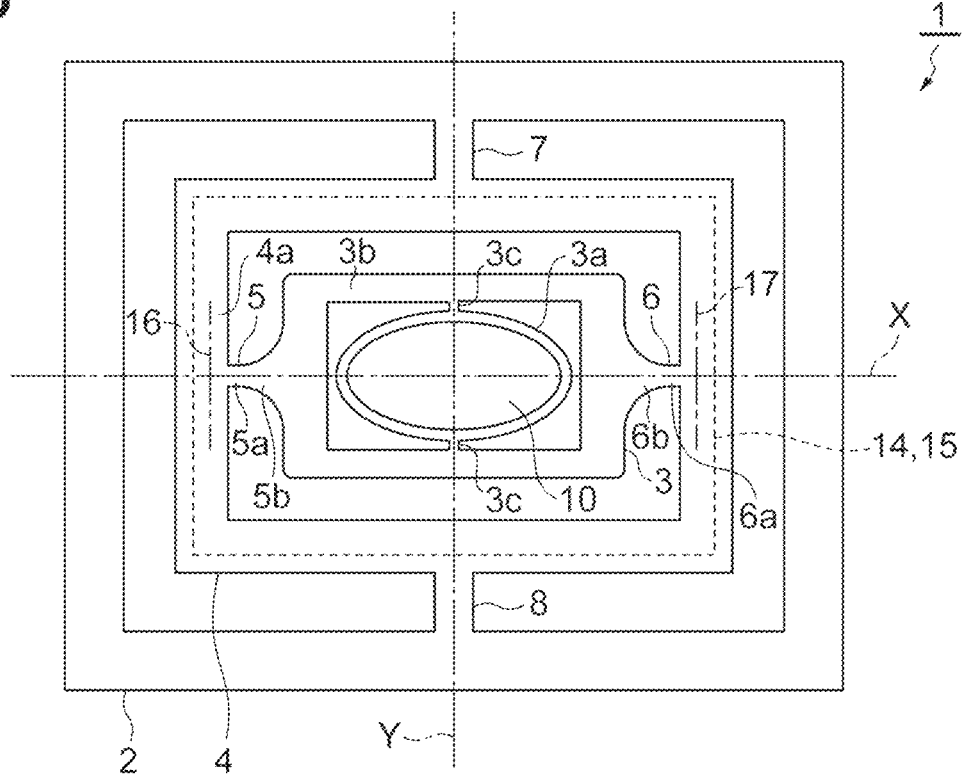
FIG. 6(a) is a plan view of an optical device according to a first modification example.
FIG. 6(b) is a plan view of an optical device according to a second modification example.
Figure 6:
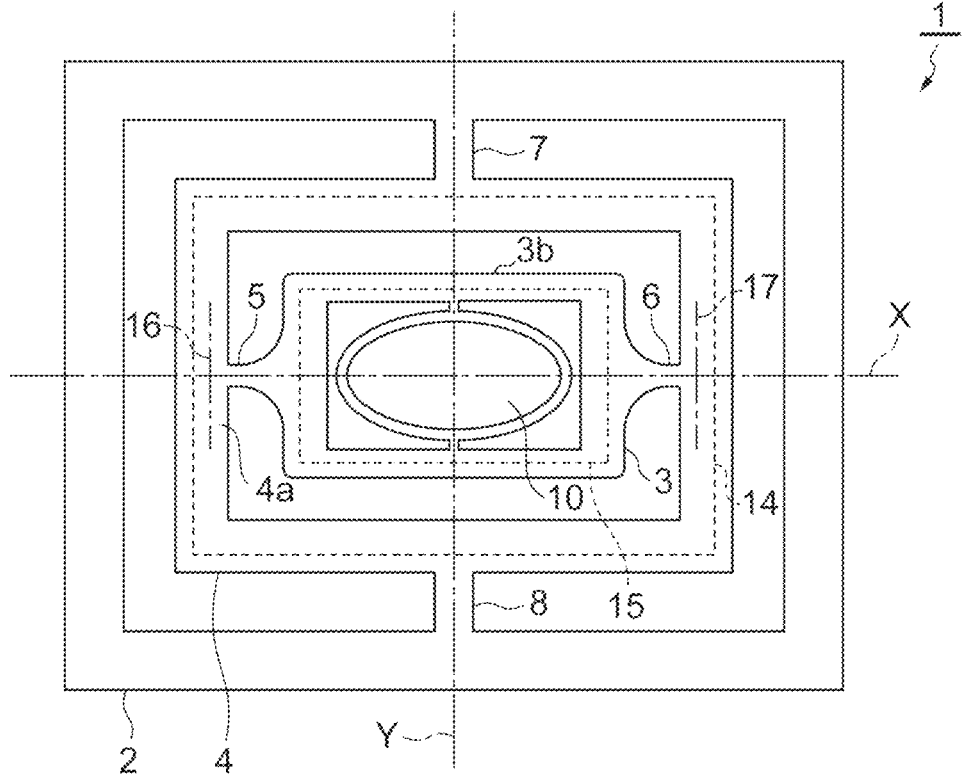

Similarly to the above embodiment, in plan view, the softening members 16 and 17 are disposed in the portion 4*a* of the second movable portion 4, the portion 4*a* extending between the coils 14 and 15 and the first torsion bars 5 and 6. Also in the first modification example described above, similarly to the above embodiment, an influence of the hardening characteristic of the first torsion bars 5 and 6 can be suppressed and reliability can be secured. In FIG. 6(*a*), the configuration of the optical device 1 is illustrated in a simplified manner, for example, the wirings 21 to 24, the external terminals 25 to 28, and the wire 29 are not illustrated.

The optical device 1 may be configured as in a second modification example illustrated in FIG. 6(*b*). In the second modification example, the coil 15 is provided in the ring portion 3*b* of the first movable portion 3. Regarding other points, the second modification example is the same as the first modification example. Also in the second modification example, the mirror surface 10 is swingable around each of the X-axis and the Y-axis by virtue of a Lorentz force to be applied to the coils 14 and 15. Also in the second modification example described above, similarly to the above embodiment, an influence of the hardening characteristic of the first torsion bars 5 and 6 can be suppressed and reliability can be secured.

Figure 7:
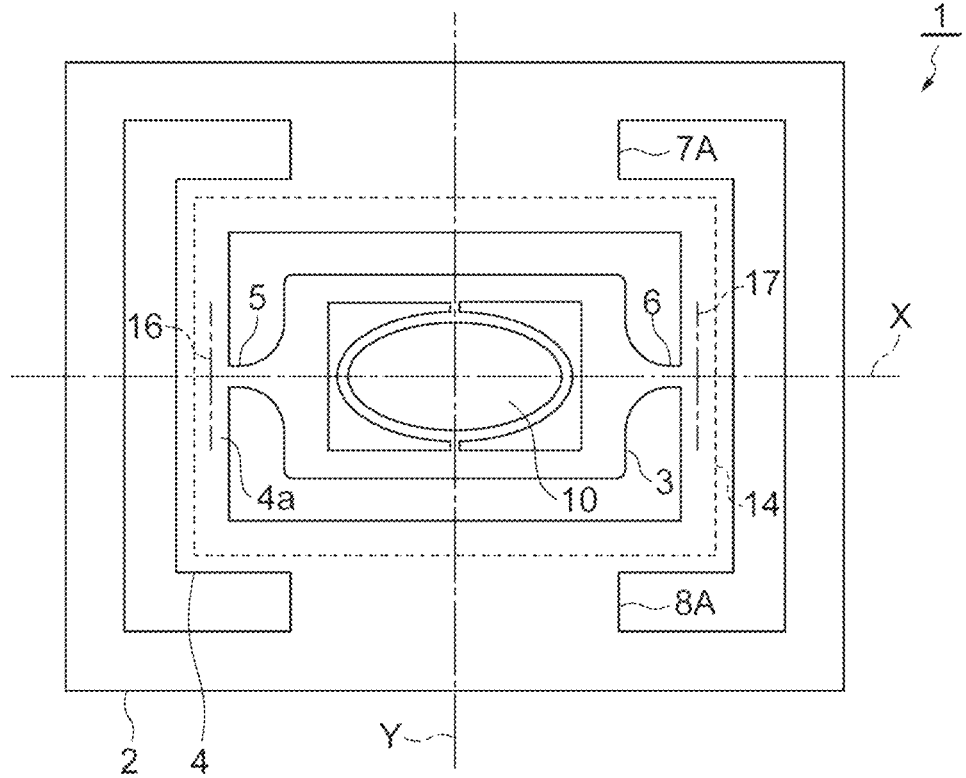
FIG. 7(a) is a plan view of an optical device according to a third modification example.
FIG. 7(b) is a plan view of an optical device according to a fourth modification example.
Figure 7:
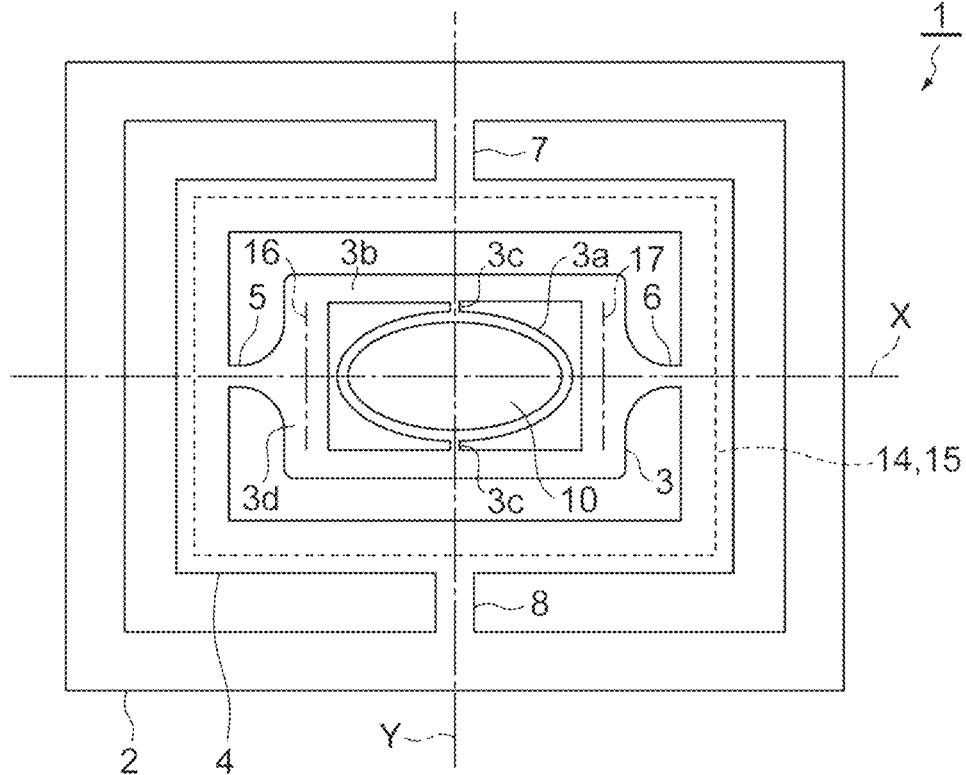

The optical device 1 may be configured as in a third modification example illustrated in FIG. 7(*a*). In the above embodiment, the first movable portion 3 swings around each of the X-axis and the Y-axis whereas, in the third modification example, the first movable portion 3 swings around only the X-axis. In the third modification example, the second coupling portions may not be torsionally deformable as the second torsion bars 7 and 8, and couple the second movable portion 4 and the support portion 2 to each other so as for the first movable portion 3 to be swingable around the X-axis by vibrating the second movable portion 4 (so as for the second movable portion 4 to be vibratable around at least the X-axis).

The degree of freedom in designing such a second coupling portion is relatively high. For example, as illustrated in FIG. 7(a), the second coupling portions may be a pair of members 7A and 8A that are disposed on both sides of the second movable portion 4 on the Y-axis to be connected to the second movable portion 4 and the support portion 2 on the Y-axis. Alternatively, the second coupling portions may be a plurality of pairs of members connected to the second movable portion 4 and the support portion 2 on the Y-axis and/or in a position other than on the Y-axis. Alternatively, the second coupling portions may be a pair of members that are disposed on both sides of the second movable portion 4 on the X-axis to be connected to the second movable portion 4 and the support portion 2 on the X-axis. In the third modification example, the coil 15 is not provided. When a drive signal is input to the coil 14, the first movable portion 3 is swingable around the X-axis. Regarding other points, the third modification example is the same as the first modification example. Also in the third modification example described above, similarly to the above embodiment, an influence of the hardening characteristic of the first torsion bars 5 and 6 can be suppressed and reliability can be secured. Furthermore, the first movable portion 3 can be swung by vibrating the second movable portion 4.

The optical device 1 may be configured as in a fourth modification example illustrated in FIG. 7(b). In the fourth modification example, in plan view, the softening members 16 and 17 are disposed in a portion 3d of the first movable portion 3, the portion 3d extending between the mirror surface 10 and the first torsion bars 5 and 6. In this example, the portion 3d is equivalent to a portion of the main body portion 3a outside the mirror surface 10, the ring portion 3b, and the pair of coupling portions 3c. In other words, the softening members 16 and 17 are provided in the first movable portion 3 so as to be located outside the mirror surface 10 and inside the first torsion bars 5 and 6 in plan view. Specifically, the softening members 16 and 17 are disposed in portions of the ring portion 3b, the portions being located on both sides of the main body portion 3a in the X-axis direction. In plan view, the softening members 16 and 17 are located between the mirror surface 10 and the first torsion bars 5 and 6. Regarding other points, the fourth modification example is the same as the first modification example.

In the fourth modification example, in plan view, the softening members 16 and 17 having the softening characteristic are disposed in the portion 3d of the first movable portion 3, the portion 3d extending between the mirror surface 10 and the first torsion bars 5 and 6. Accordingly, while excessive stress is avoided from being applied to the softening members 16 and 17, at least a part of the hardening characteristic of the first torsion bars 5 and 6 can be cancelled out by the softening characteristic of the softening members 16 and 17. As a result, also in the fourth modification example, similarly to the above embodiment, an influence of the hardening characteristic of the first torsion bars 5 and 6 can be suppressed and reliability can be secured.

Figure 8:
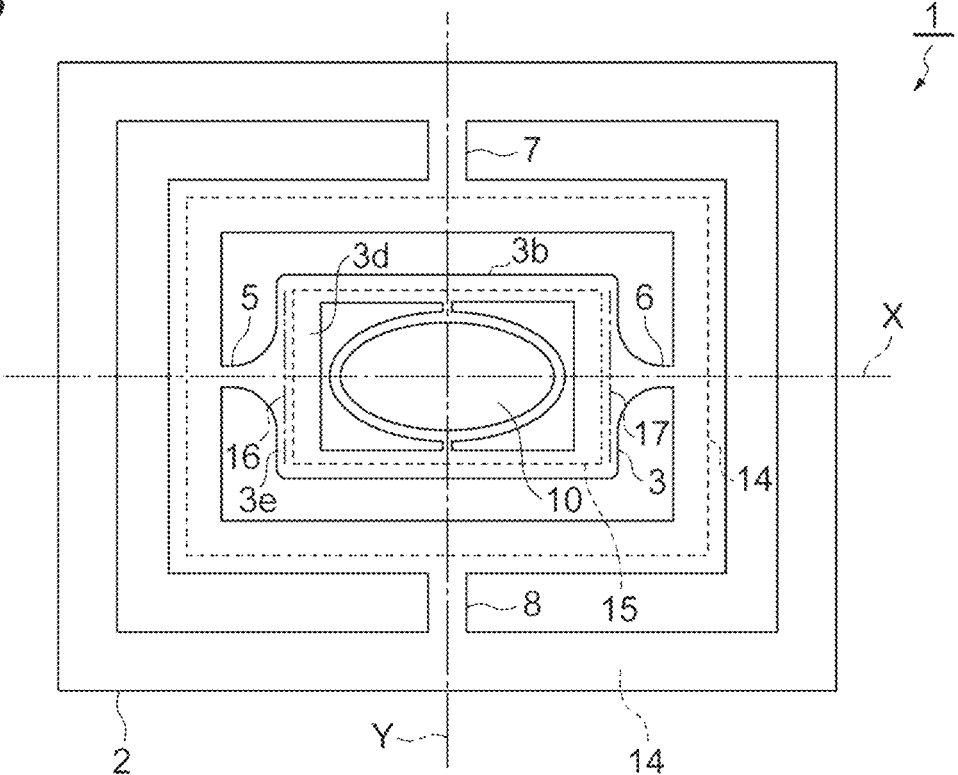
FIG. 8(a) is a plan view of an optical device according to a fifth modification example.
FIG. 8(b) is a plan view of an optical device according to a sixth modification example.
Figure 8:
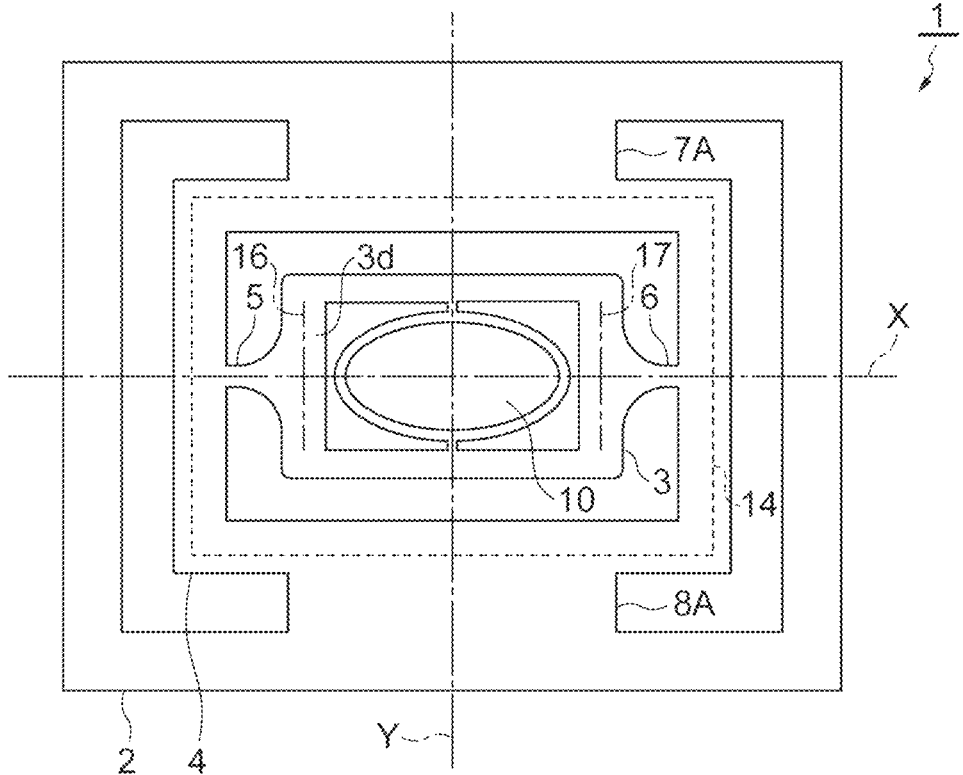

The optical device 1 may be configured as in a fifth modification example illustrated in FIG. 8(a). In the fifth modification example, the coil 15 is provided in the ring portion 3b of the first movable portion 3. In plan view, the softening members 16 and 17 are disposed in the portion 3d of the first movable portion 3, the portion 3d extending between the mirror surface 10 and the first torsion bars 5 and 6. Specifically, in plan view, the softening members 16 and 17 are disposed in a portion 3e of the first movable portion 3, the portion 3e extending between the coil 15 and the first torsion bars 5 and 6. In this example, the portion 3e is a portion of the first movable portion 3 outside the coil 15, and extends in a ring shape between the coil 15 and the first torsion bars 5 and 6. In other words, in plan view, the softening members 16 and 17 are located outside the coil 15 and inside the first torsion bars 5 and 6. In plan view, the softening members 16 and 17 are located between the coil 15 and the first torsion bars 5 and 6. Regarding other points, the fifth modification example is the same as the fourth modification example. Also in the fifth modification example, the mirror surface 10 is swingable around each of the X-axis and the Y-axis by virtue of a Lorentz force to be applied to the coils 14 and 15.

Also in the fifth modification example described above, in plan view, the softening members 16 and 17 are disposed in the portion 3d of the first movable portion 3, the portion 3d extending between the mirror surface 10 and the first torsion bars 5 and 6, and thus while excessive stress is avoided from being applied to the softening members 16 and 17, at least a part of the hardening characteristic of the first torsion bars 5 and 6 can be cancelled out by the softening characteristic of the softening members 16 and 17. As a result, similarly to the above embodiment, an influence of the hardening characteristic of the first torsion bars 5 and 6 can be suppressed and reliability can be secured. Furthermore, in the fifth modification example, in plan view, the softening members 16 and 17 are disposed in the portion 3e of the first movable portion 3, the portion 3e extending between the coil 15 and the first torsion bars 5 and 6, and thus while excessive stress is certainly avoided from being applied to the softening members 16 and 17, at least a part of the hardening characteristic of the first torsion bars 5 and 6 can be effectively cancelled out by the softening characteristic of the softening members 16 and 17.

The optical device 1 may be configured as in a sixth modification example illustrated in FIG. 8(b). In the sixth modification example, similarly to the third modification example, the first movable portion 3 swings around only the X-axis. Also in the sixth modification example, the second coupling portions may not be torsionally deformable as the second torsion bars 7 and 8, and couple the second movable portion 4 and the support portion 2 to each other so as for the first movable portion 3 to be swingable around the X-axis by vibrating the second movable portion 4 (so as for the second movable portion 4 to be vibratable around at least the X-axis). Regarding other points, the sixth modification example is the same as the fourth modification example. Also in the fifth modification example described above, similarly to the above embodiment, an influence of the hardening characteristic of the first torsion bars 5 and 6 can be suppressed and reliability can be secured.

Figure 9:
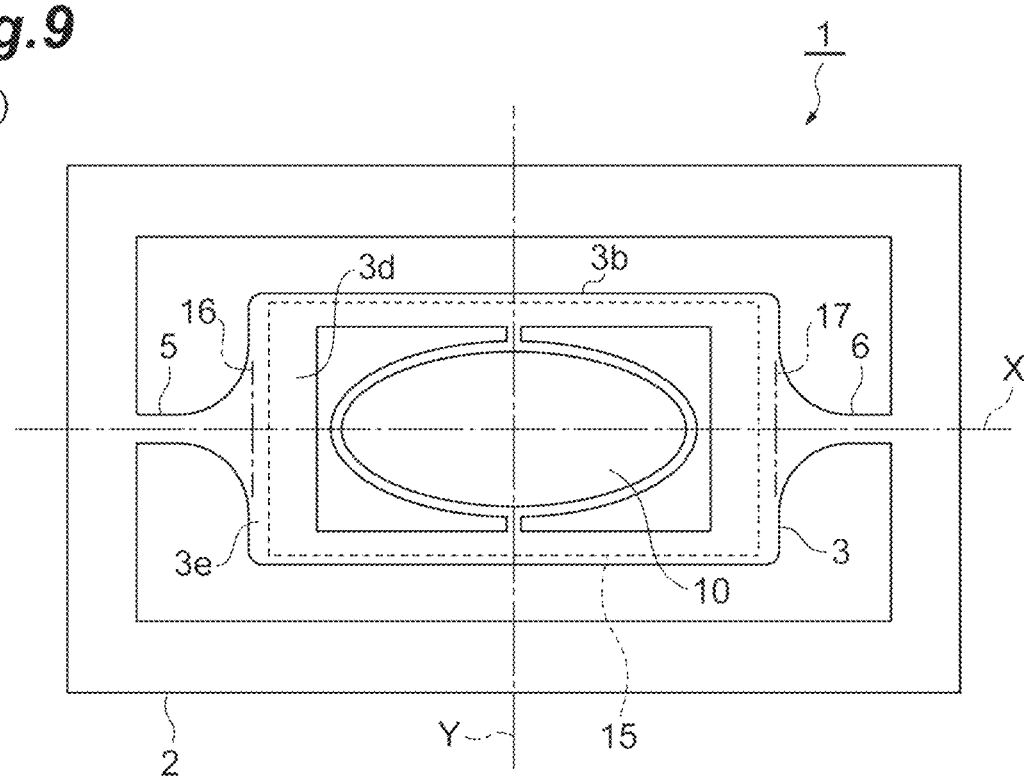
FIG. 9(a) is a plan view of an optical device according to a seventh modification example.
FIG. 9(b) is a plan view of an optical device according to a reference example.
Figure 9:
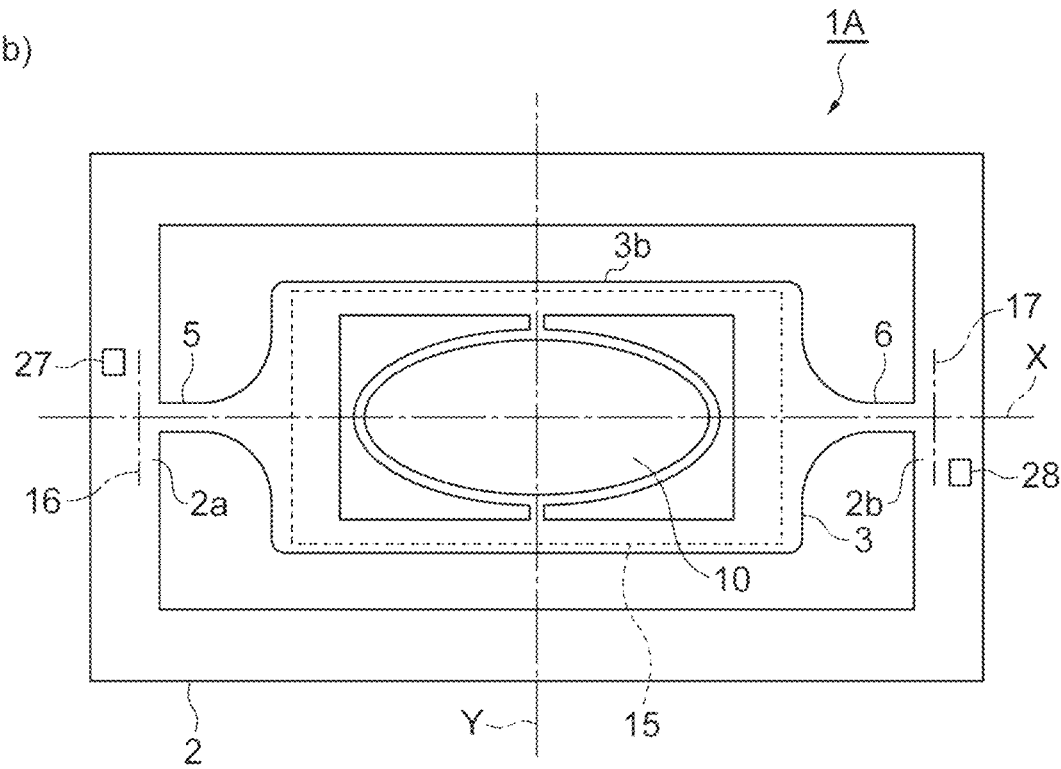

The optical device 1 may be configured as in a seventh modification example illustrated in FIG. 9(a). The optical device 1 in the seventh modification example does not include the second movable portion 4 and the second torsion bars 7 and 8. In the seventh modification example, the first torsion bars 5 and 6 directly couple the first movable portion 3 and the support portion 2 to each other. The coil 14 is not provided and only the coil 15 is provided in the ring portion 3b of the first movable portion 3. In plan view, the softening members 16 and 17 are disposed in the portion 3e of the first movable portion 3, the portion 3e extending between the coil 15 and the first torsion bars 5 and 6. The Lorentz force of the coil 15 causes the first movable portion 3 to swing around only the X-axis. Regarding other points, the seventh modification example is the same as the fourth modification example. Also in the fifth modification example described above, similarly to the above embodiment, an influence of the hardening characteristic of the first torsion bars 5 and 6 can be suppressed and reliability can be secured.

FIG. 9(b) is a plan view of an optical device 1A according to a reference example. The optical device 1A in the reference example does not include the second movable portion 4 and the second torsion bars 7 and 8. In the reference example, the first torsion bars 5 and 6 directly couple the first movable portion 3 and the support portion 2 to each other. The coil 14 is not provided and only the coil 15 is provided in the ring portion 3b of the first movable portion 3. The softening member 16 is disposed in a portion 2a of the support portion 2, the portion 2a extending between the external terminal 27 and the first torsion bar 5, and the softening member 17 is disposed in a portion 2b extending between the external terminal 28 and the first torsion bar 6. In other words, the softening members 16 and 17 are provided in the second movable portion so as to be located inside the external terminals 27 and 28 provided in the support portion 2 and outside the first torsion bars 5 and 6. The reason is that the external terminals 27 and 28 are disposed in a position where stress to be applied when the first movable portion 3 swings around the X-axis is relatively small but when the first movable portion 3 swings around the X-axis, stress having a predetermined magnitude or larger is applied to a region in the support portion 2 inside the external terminals 27 and 28.

The softening members 16 and 17 are disposed in a position where the maximum stress to be applied to the softening members 16 and 17 when the first movable portion 3 swings around the X-axis is $1/20$ times or more the maximum stress to be applied to the first torsion bars 5 and 6 when the first movable portion 3 swings around the X-axis. The softening members 16 and 17 are disposed in a position where the maximum stress to be applied to the softening members 16 and 17 when the first movable portion 3 swings around the X-axis is smaller than the yield stress of the softening members 16 and 17. Furthermore, the softening members 16 and 17 are disposed in a position where the maximum stress to be applied to the softening members 16 and 17 when the first movable portion 3 swings around the X-axis is $1/2$ times or less the maximum stress to be applied to the first torsion bars 5 and 6 when the first movable portion 3 swings around the X-axis. The Lorentz force of the coil 15 causes the first movable portion 3 to swing around only the X-axis. Regarding other points, the optical device 1A is the same as the optical device 1 according to the first modification example. Also in the reference example described above, similarly to the above embodiment, an influence of the hardening characteristic of the first torsion bars 5 and 6 can be suppressed and reliability can be secured.

In the above embodiment, the first movable portion 3 and the second movable portion 4 are subjected to a linear operation around the Y-axis whereas, in another modification example, the first movable portion 3 and the second movable portion 4 may be subjected to a resonance operation around the Y-axis. In the above embodiment, the pair of coils 14 and 15 are provided in the second movable portion 4 whereas only one coil may be provided in the second movable portion 4. Also in this case, the mirror surface 10 can be swingable around each of the X-axis and the Y-axis by inputting a drive signal to the coil. In the above embodiment, an electromotive force monitor coil that measures an electromotive force may be provided in the second movable portion 4, and a temperature sensor coil that measures temperature may be provided in the support portion 2.

In the above embodiment, the mirror surface 10 is driven by electromagnetic force; however, the mirror surface 10 may be driven by piezoelectric elements. In this case, instead of the coils 14 and 15, for example, piezoelectric membranes are provided as drive elements. Alternatively, the mirror surface 10 may be driven by electrostatic force. In this case, instead of the coils 14 and 15, for example, electrostatic comb teeth are provided as drive elements. Also in these modification examples, similarly to the above embodiment, an influence of the hardening characteristic of the first torsion bars 5 and 6 can be suppressed and reliability can be secured. The piezoelectric elements may be disposed, for example, in the second connection portions 42A and 42B, the first linear portions 43A and 43B, and the second linear portions 44A and 44B of the second movable portion 4. In this case, a portion of the second movable portion 4, the portion extending between the piezoelectric elements and the first torsion bars 5 and 6, are the first connection portions 41A and 41B, the third linear portions 45A and 45B, and the fourth linear portions 46A and 46B.

Alternatively, the drive element may be a magnet. In this case, the mirror surface 10 can be driven by a moving magnet method. In this case, the drive element may not be electrically connected to the outside. In the moving magnet method, for example, a magnetic field generated by the coil provided in the optical device 1 acts on the magnet, and thus the movable portion (the first movable portion and/or the second movable portion) provided with the magnet operates. As a result, the mirror surface 10 is driven. Namely, an optical device may include a support portion, a first movable portion having an optical surface, a second movable portion having a frame shape and surrounding the first movable portion, a first coupling portion coupling the first movable portion and the second movable portion to each other so as for the first movable portion to be swingable around a first axis, a second coupling portion coupling the second movable portion and the support portion to each other, a magnet as a drive element provided to the second movable portion, and a softening member which has a softening characteristic and to which stress is applied when the first movable portion swings around the first axis. When viewed in a direction perpendicular to the optical surface, the softening member may be disposed in a portion of the second movable portion, the portion extending between the drive element and the first coupling portion, and may not be electrically connected to an outside. Alternatively, an optical device may include a support portion, a first movable portion having an optical surface, a second movable portion having a frame shape and surrounding the first movable portion, a first coupling portion including a linear portion that extends along a first axis and is connected to the first movable portion, and coupling the first movable portion and the second movable portion to each other so as for the first movable portion to be swingable around the first axis, a second coupling portion coupling the second movable portion and the support portion to each other, a magnet as a drive element provided to the second movable portion, and a softening member which has a softening characteristic and to which stress is applied when the first movable portion swings around the first axis. When viewed in a direction perpendicular to the optical surface, the softening member may be disposed in a portion of the second movable portion, the portion extending between the drive element and the linear portion, and may not be electrically connected to an outside. Alternatively, an optical device may include a support portion, a first movable portion having an optical surface, a first coupling portion coupling the first movable portion and the support portion to each other so as for the first movable portion to be swingable around a first axis, a magnet as a drive element provided to at least one of the support portion and the first movable portion, and a softening member which has a softening characteristic and to which stress is applied when the first movable portion swings around the first axis. When viewed in a direction perpendicular to the optical surface, the softening member may be disposed in a portion of the first movable portion, the portion extending between the optical surface and the first coupling portion, and may not be electrically connected to an outside. Alternatively, an optical device may include a support portion, a first movable portion having an optical surface, a first coupling portion including a linear portion that extends along a first axis and is connected to the first movable portion, and coupling the first movable portion and the support portion to each other so as for the first movable portion to be swingable around the first axis, a magnet as a drive element provided to at least one of the support portion and the first movable portion, and a softening member which has a softening characteristic and to which stress is applied when the first movable portion swings around the first axis. When viewed in a direction perpendicular to the optical surface, the softening member may be disposed in a portion of the first movable portion, the portion extending between the optical surface and the linear portion, and may not be electrically connected to an outside. Alternatively, an optical device may include a support portion, a first movable portion having an optical surface, a first coupling portion coupling the first movable portion and the support portion to each other so as for the first movable portion to be swingable around a first axis, a magnet as a drive element provided in at least one of the support portion and the first movable portion, and a softening member which has a softening characteristic and to which stress is applied when the first movable portion swings around the first axis. The softening member may be provided in the first movable portion and may not be electrically connected to an outside.

In the above embodiment, the first torsion bars 5 and 6 are defined as "a portion where stress to be applied when the first movable portion 3 swings around the X-axis is 90% or more of the maximum stress to be applied to the first torsion bars 5 and 6 when the first movable portion 3 swings around the X-axis." However, in the above embodiment, it can be regarded that the first torsion bar 5 includes only the linear portion 5a and each of the widened portions 5b is included in the first movable portion 3 or the second movable portion 4. Similarly, it can be regarded that the first torsion bar 6 includes only the linear portion 6a and each of the widened portions 6b is included in the first movable portion 3 or the second movable portion 4. In this case, each of the linear portions 5a and 6a is directly connected to the first movable portion 3 and the second movable portion 4. In plan view, the softening members 16 and 17 are disposed in the portion 4a of the second movable portion 4, the portion 4a extending between the coils 14 and 15 and the linear portions 5a and 6a. In other words, in plan view, the softening members 16 and 17 are provided in the second movable portion 4 so as to be located inside the coils 14 and 15 and outside the linear portions 5a and 6a. Also in the first to third modification examples and the reference example, in plan view, the softening members 16 and 17 are disposed in the portion 4a of the second movable portion 4, the portion 4a extending between the coils 14 and 15 and the linear portions 5a and 6a. In other words, in plan view, the softening members 16 and 17 are located inside the coils 14 and 15 and outside the linear portions 5a and 6a. Furthermore, in the fourth modification example, each of the first torsion bars 5 and 6 may include a linear portion and a widened portion connected between the linear portion and the second movable portion 4, and the linear portion may be directly connected to the first movable portion 3. In this configuration, in plan view, the softening members 16 and 17 may be disposed in a portion of the first movable portion 3, the portion extending between the mirror surface 10 and the linear portion. Also in this case, similarly to the above embodiment, an influence of the hardening characteristic of the first torsion bars 5 and 6 can be suppressed and reliability can be secured.

The materials and the shapes of each configuration are not limited to the materials and the shapes described above, and various materials and shapes can be adopted. For example, the softening member 16 may be made of a resin material. However, the softening member 16 exhibits a noticeable plastic characteristic and has a high yield stress, and thus it is preferable that the softening member 16 is made of copper. The softening member 16 may include only one dummy wiring portion 16a. The dummy wiring portion 16a may not have the same configuration as that of the coils 14 and 15, for example, may be disposed on the surface of the second movable portion 4 or may have a cross-sectional shape different from that of the coils 14 and 15. Namely, the softening member 16 may have the softening characteristic, and stress may be applied to the softening member 16 when the first movable portion 3 swings around the X-axis. These points also apply to the softening member 17.

The softening members 16 and 17 may be provided on a surface (surface on a magnetic field generation portion 9 side) of the second movable portion 4 opposite to the surface on which the coils 14 and 15 are provided. Only one of the pair of softening members 16 and 17 may be provided. A plurality of pairs of the softening members may be provided. For example, in the above embodiment, not only the softening members 16 and 17 may be provided in the second movable portion 4 but also, similarly to the fourth modification example, the softening members may be provided in the first movable portion 3.

The second movable portion 4 may have an external shape such as a substantially circular shape, a substantially elliptical shape, a substantially quadrilateral shape, or a substantially diamond shape in plan view. The ring portion 3b may not be provided and the first torsion bars 5 and 6 may be directly connected to the main body portion 3a. In the above embodiment, the first coupling portion is formed of the first torsion bars 5 and 6 having a plate shape; however, the shape of the first coupling portion is not limited and may be any shape such as a bar shape. Each of the first torsion bars 5 and 6 may include a meandering portion extending in a meandering manner in plan view. Both of the pair of widened portions 5b may not be provided and both of the pair of widened portions 6b may not be provided. The second torsion bars 7 and 8 may couple the second movable portion 4 and the support portion 2 to each other in a position other than on the Y-axis so as for the second movable portion 4 to be swingable around the Y-axis. The first movable portion 3 may have an optical surface other than the mirror surface 10, for example, may have a diffraction grating surface. In the above embodiment, the pair of coils 14 and 15 are disposed to alternately line up whereas, in plan view, one of the coils 14 and 15 may be disposed inside the other. Three or more wires 29 may be connected to each of the external terminals 25 to 28.

In the above embodiment and the modification examples, when the softening members 16 and 17 do not have a yield stress, a 0.2% proof stress may be used instead of the yield stress. Namely, the softening members 16 and 17 may be disposed in a position where the maximum stress to be applied to the softening members 16 and 17 when the first movable portion 3 swings around the X-axis is smaller than the 0.2% proof stress of the softening members 16 and 17. In a case where the maximum stress to be applied to the softening members 16 and 17 when the first movable portion 3 swings around the X-axis is smaller than the 0.2% proof stress or the yield stress of the softening members 16 and 17, for example, when the first movable portion 3 swings 10,000 times at a normal deflection angle (from approximately ±1 degree to ±20 degrees) or at the resonance frequency, the increase rate (ratio in cross-sectional area between before swinging and after swinging) in cross-sectional area of the softening members 16 and 17 is 10% or less. Alternatively, when the first movable portion 3 swings for 1,000 hours, the increase rate in cross-sectional area of the softening members 16 and 17 is 10% or less. The yield stress and the 0.2% proof stress may be measured by, for example, a method according to JIS Z 2241.

REFERENCE SIGNS LIST

1: optical device, 2: support portion (fixed portion), 3: first movable portion, 3*d*: portion, 3*e*: portion, 4: second movable portion (support portion), 4*a*: portion, 5, 6: first torsion bar (first coupling portion), 5*a*, 6*a*: linear portion, 7, 8: second torsion bar (second coupling portion), 10: mirror surface (optical surface), 14, 15: coil (drive element), 16, 17: softening member, P: center of first movable portion.

The invention claimed is:

1. An optical device comprising:
   a support portion;
   a first movable portion having an optical surface;
   a second movable portion having a frame shape and surrounding the first movable portion;
   a first coupling portion coupling the first movable portion and the second movable portion to each other so as for the first movable portion to be swingable around a first axis;
   a second coupling portion coupling the second movable portion and the support portion to each other;
   a drive element provided to the second movable portion and electrically connected to an outside; and
   a softening member which has a softening characteristic and to which stress is applied when the first movable portion swings around the first axis, the softening member being a member different from the second movable portion and formed by material different from material of the second movable portion,
   wherein the softening member is disposed in a groove formed in the second movable portion or on a surface of the second movable portion and when viewed in a direction perpendicular to the optical surface, the softening member is provided to a portion of the second movable portion, extending between the drive element and the first coupling portion, and is not electrically connected to the outside.

2. An optical device comprising:
   a support portion;
   a first movable portion having an optical surface;
   a second movable portion having a frame shape and surrounding the first movable portion;
   a first coupling portion including a linear portion that extends along a first axis and is connected to the first movable portion, and coupling the first movable portion and the second movable portion to each other so as for the first movable portion to be swingable around the first axis;
   a second coupling portion coupling the second movable portion and the support portion to each other;
   a drive element provided to the second movable portion and electrically connected to an outside; and
   a softening member which has a softening characteristic and to which stress is applied when the first movable portion swings around the first axis, the softening member being a member different from the second movable portion and formed by material different from material of the second movable portion,
   wherein the softening member is disposed in a groove formed in the second movable portion or on a surface of the second movable portion and when viewed in a direction perpendicular to the optical surface, the softening member is provided to a portion of the second movable portion, extending between the drive element and the linear portion, and is not electrically connected to the outside.

3. The optical device according to claim 1,
   wherein the second coupling portion couples the second movable portion and the support portion to each other so as for the first movable portion to be swingable around the first axis by vibrating the second movable portion.

4. The optical device according to claim 1,
   wherein the second coupling portion couples the second movable portion and the support portion to each other so as for the second movable portion to be swingable around a second axis that intersects with the first axis.

5. An optical device comprising:
   a support portion;
   a first movable portion having an optical surface;
   a first coupling portion coupling the first movable portion and the support portion to each other so as for the first movable portion to be swingable around a first axis;
   a drive element provided to at least one of the support portion and the first movable portion and electrically connected to an outside; and
   a softening member which has a softening characteristic and to which stress is applied when the first movable portion swings around the first axis, the softening member being a member different from the first movable portion and formed by material different from material of the first movable portion,
   wherein the softening member is disposed in a groove formed in the first movable portion or on a surface of the first movable portion and when viewed in a direction perpendicular to the optical surface, the softening member is provided to a portion of the first movable portion, extending between the optical surface and the first coupling portion, and is not electrically connected to the outside.

6. The optical device according to claim 5,
   wherein when viewed in the direction perpendicular to the optical surface, the softening member is provided to a portion of the first movable portion, the portion extending between the drive element provided to the first movable portion and the first coupling portion.

7. An optical device comprising:
a support portion;
a first movable portion having an optical surface;
a first coupling portion including a linear portion that extends along a first axis and is connected to the first movable portion, and coupling the first movable portion and the support portion to each other so as for the first movable portion to be swingable around the first axis;
a drive element provided to at least one of the support portion and the first movable portion and electrically connected to an outside; and
a softening member which has a softening characteristic and to which stress is applied when the first movable portion swings around the first axis, the softening member being a member different from the first movable portion and formed by material different from material of the first movable portion,
wherein the softening member is disposed in a groove formed in the first movable portion or on a surface of the first movable portion and when viewed in a direction perpendicular to the optical surface, the softening member is provided to a portion of the first movable portion, extending between the optical surface and the linear portion, and is not electrically connected to the outside.

8. The optical device according to claim 7,
wherein when viewed in the direction perpendicular to the optical surface, the softening member is provided to a portion of the first movable portion, the portion extending between the drive element, which is provided to the first movable portion, and the linear portion.

9. The optical device according to claim 5, further comprising:
a fixed portion,
wherein the support portion is coupled to the fixed portion so as for the first movable portion to be swingable around the first axis by vibrating the support portion.

10. The optical device according to claim 5, further comprising:
a fixed portion,
wherein the support portion is coupled to the fixed portion so as for the support portion to be swingable around a second axis that intersects with the first axis.

11. The optical device according to claim 1,
wherein the softening member is provided to a position where a maximum stress to be applied to the softening member when the first movable portion swings around the first axis is 1/20 times or more a maximum stress to be applied to the first coupling portion when the first movable portion swings around the first axis.

12. The optical device according to claim 1,
wherein the softening member is provided to a position where a maximum stress to be applied to the softening member when the first movable portion swings around the first axis is smaller than a 0.2% proof stress or a yield stress of the softening member.

13. The optical device according to claim 1, further comprising:
a pair of the softening members,
wherein when viewed in the direction perpendicular to the optical surface, the pair of softening members are symmetrically disposed relative to each other with respect to a straight line passing through a center of the first movable portion and perpendicular to the first axis.

14. The optical device according to claim 1,
wherein the softening member is made of metal or resin material.

15. The optical device according to claim 1,
wherein the softening member is embedded in a groove.

16. The optical device according to claim 1,
wherein the drive element is a coil.

17. The optical device according to claim 1,
wherein the drive element is a piezoelectric element.

18. The optical device according to claim 1,
wherein at least a part of the first coupling portion is located on the first axis.

19. An optical device comprising:
a support portion;
a first movable portion having an optical surface;
a first coupling portion coupling the first movable portion and the support portion to each other so as for the first movable portion to be swingable around a first axis;
a drive element provided to at least one of the support portion and the first movable portion and electrically connected to an outside; and
a softening member which has a softening characteristic and to which stress is applied when the first movable portion swings around the first axis, the softening member being a member different from the first movable portion and formed by material different from material of the first movable portion,
wherein the softening member is disposed in a groove formed in the first movable portion or on a surface of the first movable portion, and is not electrically connected to the outside.

20. The optical device according to claim 19, wherein the softening member is provided to a position where a maximum stress to be applied to the softening member when the first movable portion swings around the first axis is 1/20 times or more a maximum stress to be applied to the first coupling portion when the first movable portion swings around the first axis.

21. The optical device according to claim 19, wherein the softening member is provided to a position where a maximum stress to be applied to the softening member when the first movable portion swings around the first axis is smaller than a 0.2% proof stress or a yield stress of the softening member.

22. The optical device according to claim 19, wherein the softening member is made of metal or resin material.

* * * * *